(12) United States Patent
Efros et al.

(10) Patent No.: US 8,742,959 B1
(45) Date of Patent: Jun. 3, 2014

(54) COMPRESSING A TIME SERIES OF DATA

(71) Applicants: Pavel Efros, Karlsruhe (DE); Frank Eichinger, Karlsruhe (DE); Stamatis Karnouskos, Karlsruhe (DE)

(72) Inventors: Pavel Efros, Karlsruhe (DE); Frank Eichinger, Karlsruhe (DE); Stamatis Karnouskos, Karlsruhe (DE)

(73) Assignee: SAP AG, Walldorf (DE)

( * ) Notice: Subject to any disclaimer, the term of this patent is extended or adjusted under 35 U.S.C. 154(b) by 0 days.

(21) Appl. No.: 13/746,802

(22) Filed: Jan. 22, 2013

(51) Int. Cl.
*H03M 7/30* (2006.01)

(52) U.S. Cl.
USPC ............................................. 341/87; 341/51

(58) Field of Classification Search
USPC ........................................ 341/51, 87
See application file for complete search history.

(56) References Cited

U.S. PATENT DOCUMENTS

| | | | | |
|---|---|---|---|---|
| 7,617,010 | B2 * | 11/2009 | Bocharov et al. ............. | 700/29 |
| 2004/0260664 | A1 * | 12/2004 | Thiesson et al. ............. | 706/21 |
| 2006/0129395 | A1 * | 6/2006 | Thiesson et al. ............. | 704/240 |
| 2006/0247900 | A1 * | 11/2006 | Brocklebank ............. | 702/189 |

OTHER PUBLICATIONS

Papaioannou, et al, "Towards Online Multi-Model Approximation of Time Series", 12th IEEE International Conference on Mobile Data Management (MDM), Jun. 2011, 6 pages.

* cited by examiner

*Primary Examiner* — Khai M Nguyen
(74) *Attorney, Agent, or Firm* — Brake Hughes Bellermann LLP

(57) ABSTRACT

According to an example implementation, at least one non-transitory computer-readable storage medium may include instructions stored thereon. When executed by at least one processor, the instructions may be configured to cause a computing system to select at least one function type to approximate an interval of data points within a time series, the at least one function type being less than all of a plurality of functions available to approximate the interval, while the first function type will approximate the interval of data points within a maximum allowable error, add data points from the time series to the interval, and when the first function type will no longer approximate the interval with the added data points within the maximum allowable error, select a function of a different type or a function of a different term from the plurality of functions to approximate the interval with the added data points.

20 Claims, 17 Drawing Sheets

COMPRESSING A TIME SERIES OF DATA

TECHNICAL FIELD

This description relates to data storage and data compression.

BACKGROUND

The proliferation of data creates opportunities to make useful decisions based on the data. For example, energy consumption data may facilitate efficient energy consumption, or may identify appliances used in a household connected to a smart meter. However, the large amount of data may occupy an excessive amount of storage.

SUMMARY

According to one general aspect, at least one non-transitory computer-readable storage medium may include instructions stored thereon. When executed by at least one processor, the instructions may be configured to cause a computing system to at least determine at least one function to approximate a first time series of data. The determining the at least one function may include determining whether a first function of a first type with at least one parameter will approximate a first interval within the first time series of data within a predetermined error margin, if the first function of the first type with the at least one parameter will approximate the first interval within the predetermined error margin, updating the first interval by adding a subsequent data point from the first time series of data to the first interval and determining a second function of the first type with the at least one parameter to approximate the first interval, and if the first function of the first type with at least one parameter will not approximate the first interval within the predetermined error margin, determining whether a third function of the first type with at least one parameter plus at least one additional parameter will approximate the first interval within the predetermined error margin. If the third function of the first type with at least one additional parameter will approximate the first interval within the predetermined error margin, the approximation may include updating the first interval by adding a subsequent data point from the first time series of data to the first interval and determining a fourth function of the first type with the at least one additional parameter to approximate the updated first interval, and if the third function of the first type with the additional parameter will not approximate the first interval within the predetermined error margin, continuing determining whether the functions of the first type with additional parameters will approximate the first interval within the predetermined error margin until a maximum number of parameters is reached. The instructions may also be configured to cause the computing system to send a value(s) of the parameter(s) for the first class of function to a receiving system.

According to another general aspect, at least one non-transitory computer-readable storage medium may include instructions stored thereon. When executed by at least one processor, the instructions may be configured to cause a computing system to at least select at least one function type to approximate an interval of data points within a time series, the at least one function type being less than all of a plurality of functions available to approximate the interval, while the first function type will approximate the interval of data points within a maximum allowable error, add data points from the time series to the interval, when the first function type will no longer approximate the interval with the added data points within the maximum allowable error, select a function of a different type or a function of a different term from the plurality of functions to approximate the interval with the added data points, and send a description of the first function and the function of the different type or the function of the different term to a receiving device.

According to another general aspect, at least one non-transitory computer-readable storage medium may include instructions stored thereon. When executed by at least one processor, the instructions may be configured to cause a computing system to at least, while an $n^{th}$ order polynomial function fits a first segment of data points from a time series within a maximum allowable error, add a new data point from the time series to the first segment and determine whether the $n^{th}$ order polynomial function still fits the first segment. When the $n^{th}$ order polynomial function no longer fits the first segment, the instructions may be configured to cause the computing system to store beginning and end data points which fit into the $n^{th}$ order polynomial function within the maximum allowable error, determine a lowest order, $(n+m)^{th}$, polynomial function that does fit the first segment, and, while the $(n+m)^{th}$ order polynomial function fits the first segment of data points within the maximum allowable error, add a new data point from the time series to the first segment and determine whether the $(n+m)^{th}$ order polynomial function still fits the first segment. When the $(n+m)^{th}$ order polynomial function no longer fits the first segment, the instructions may be configured to cause the computing system to store beginning and end data points which fit into the $(n+m)^{th}$ order polynomial function within the maximum allowable error, determine a first ratio by dividing a number of data points which fit into the $n^{th}$ order polynomial function within the maximum allowable error by n, determine a second ratio by dividing a number of data points which fit into the $(n+m)^{th}$ order polynomial function within the maximum allowable error by (n+m), and select, for membership in the first segment, either the data points between the stored beginning and end data points which fit into the $n^{th}$ order polynomial function or the data points between the stored beginning and end data points which fit into the $(n+m)^{th}$ order polynomial function, based on comparing the first ratio to the second ratio. The instructions may also be configured to cause the computing system to determine a lowest order polynomial function for which data points within a second segment fit within the maximum allowable error, the second segment beginning after the stored end data point that fits into either the $n^{th}$ order polynomial function or the $(n+m)^{th}$ order polynomial function, based on the comparing the first ratio to the second ratio.

The details of one or more implementations are set forth in the accompa-nying drawings and the description below. Other features will be apparent from the description and drawings, and from the claims.

DETAILED DESCRIPTION

Figure 1:
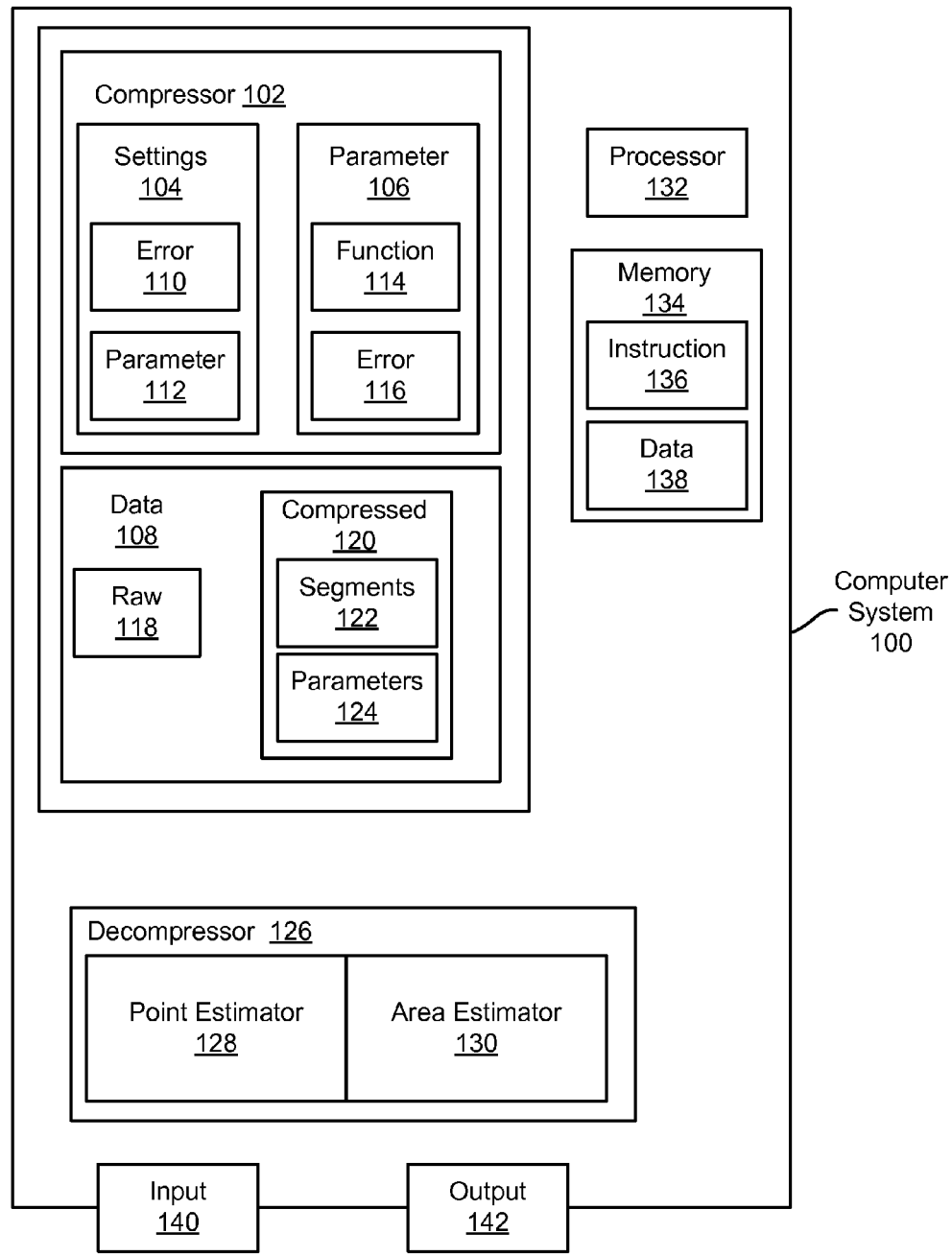
FIG. 1 is a block diagram of a computing system for compressing and/or decompressing data according to an example implementation.

Frequent measurements can result in large amounts of data. For example, smart meters can perform measurements of power or electricity usage every second, every minute, every fifteen minutes, every hour, or at any desired interval. The smart metering can facilitate smart grids and near real-time communication of the measurements.

For example, data representing events within a manufacturing facility may fluctuate over the course of a day and/or over the lifetime of equipment within the facility. Such data may provide insight into an operational status of the facility, in order to optimize such operations. Additional/alternative examples of such data streams include temperature or other environmental data collected by sensors, computer network analytics, patient health data, or data describing business processes.

However, high frequencies of measurements can result in large volumes of data for the multiple times series of measurements. Storing every data point could become impractical at high frequencies of measurement.

Compressing the data from the time series, or series of data, can provide approximations of the data within a tolerable margin of error. The time series may be a sequence of measurements measured at successive time instants. The successive time instants may be spaced at successive time intervals, such as every second, every minute, every fifteen minutes, or every hour. The data points or time points may be equally or unequally spaced. The data points may, for example, be measured and/or occur with a fixed frequency or intervals, or at random successive points in time. The frequency of measurements may also be determined by an algorithm, such as more frequent measurements when the measurements show greater change or variance, and less frequent measurements when the measurements show less change or variance. The time series may be compressed as the data points are measured, or a time series may be stored in an intermediary database and compressed before being sent to another database for storage.

The data points in the time series can be compressed by a piecewise regression. The data may be divided into intervals of variable (temporal) length, with the intervals each including different numbers of data points, and regression functions may be determined to approximate each interval. The lengths of the intervals and the determined functions may be based on a user-defined maximum tolerable error value and/or maximum allowable error. The maximum tolerable error value, or predetermined error margin, may be per data point, i.e., the regression function per interval may not allow any single data point to be approximated with an error greater than the user-defined maximum tolerable error value. The compression may result in identifiers of the intervals or time series, start and/or end points of intervals or time series, function type identifiers of the intervals or time series, function terms indicating a number of parameters or coefficients in the functions, and/or parameter values such as polynomial orders and/or polynomial coefficients. The function types may include, for example, polynomial functions, sinusoidal functions, exponential functions, logarithmic functions, or asymptotic functions. The terms of the functions, as well as the number of polynomial coefficients or number of frequencies for a sinusoidal function, of the intervals or time series may vary. The compression may include, for example, determining a least number of parameters or coefficients, such as a lowest order polynomial, that will approximate each interval or time series within a maximum allowable error, with the lowest order polynomial being unique and/or different for each interval or time series.

FIG. 1 is a block diagram of a computing system 100 for compressing and/or decompressing data according to an example implementation. The computing system 100 may include a server, personal computer, laptop or notebook computer, tablet computer, or mobile system that receives the raw data from a measuring device and compresses the data before sending the compressed data to a subsequent storage location, or may include an embedded processor included in the measuring device that compresses the data before sending the compressed data to a receiving device for storage. The computing system may also include a distributed system in which different functions are performed by different devices, such as in a cloud-based environment.

The computing system 100 may include a compressor module 102. The compressor module 102 may compress the raw data to reduce the amount of storage required to retrieve the data within the user-defined maximum tolerable error value. The compressor module 102 may determine functions, such as polynomial functions or sinusoidal functions (such as Fourier series) that each approximate an interval or time series within the raw data within the user-defined maximum tolerable error value. The compressor module 102 may determine, for example, the lowest-order or least complex functions, such as the functions with the fewest coefficients, that approximate the intervals or times within the raw data, thereby reducing the number of values that need to be stored to approximate the raw data within the user-defined maximum tolerable error value.

The compressor module 102 may compress the raw data based on settings stored by a settings module 104. The compression may result in parameters stored by a parameter module 106. The compressor module 102 may store both raw data and compressed data in a data module 108. These are merely examples, and different modules, objects, and/or processors may be used to compress the data.

The settings module 104 may store settings for compressing the data. The settings may be user-defined, and may be received and stored based on user input. The settings may include, for example, a maximum error 110 and maximum number of parameters 112. The maximum error 110 may be the user-defined maximum tolerable error value. In an example, the maximum error may be a maximum allowable difference between the compressed or approximated value of a data point and the actual, measured, or raw value of the data point. In this example, no single value may be approximated with an error beyond the maximum error 110. This example may ensure that each compressed or approximated value is accurate within the maximum error. In other examples, the maximum error may be a maximum average error for compressed or approximated values within an interval or time series, or a maximum average error for compressed or approximated values within an entire set of raw data.

The maximum number of parameters 112 may determine a maximum complexity of a function used to approximate the data. In the example in which the functions used to approximate each interval or time series are polynomials, the maximum number of parameters 112 may determine the highest order polynomial allowed. In an example in which the functions used to approximate each interval or time series are sinusoidal or Fourier series functions, the maximum number of parameters may determine the highest frequency of sinusoidal (i.e., sine and cosine) functions used to approximate or compress the raw data. In the example of sinusoidal or Fourier series functions, the highest frequency of sinusoidal functions may also be based on the frequency, or interval between, the data points.

The settings 104 may also include an initial number of parameters, such as at least one parameter. When approximating an interval of data points, the compressor 102 may start with an initial number of parameters, such as one, that may indicate a value for a constant value function. The number of parameters may increase when functions with the initial number of parameters will no longer approximate the interval within a maximum allowable error. The initial number of parameters may also be a value greater than one, such as two, three, four, five, or any other number.

The parameters module 106 may determine parameters to approximate the raw data. The parameters may compress or reduce the amount of storage required to store the approximated data. The stored parameters may include, for example, types of functions, terms which may include orders or complexities of functions, coefficients of the functions, and/or beginning and/or end points of intervals, segments, or time series within the data.

The parameter module 106 may include a function module 114 and an error module 116. The function module 114 may determine functions to approximate intervals, segments, or time series of data. The function module 114 may select at least one function to approximate an interval, segment, or time series of data. The function module 114 may select the at least one function from a plurality of functions available to approximate the interval, segment, or time series of data. The function module 114 may approximate the interval, segment, or time series using the selected function, adding data points from a time series to the interval or segment, as long as the selected function approximates the interval, segment, or time series within a maximum allowable error. The function module 114 may add a single data point at a time, adding a single data point and then approximating and determining whether the function approximates the interval, segment, or time series within the maximum allowable error for each added data point, or may add multiple data points, such as two, three, or more data points at a time, and approximate the interval, segment, or time series and determine whether the function approximates the interval, segment, or time series within the maximum allowable error with the multiple added data points. The function module 114 may add a same number (single or multiple) of data points for each approximation and determination, or may change the number of data points added for each approximation and determination. The function module 114 may determine how many data points to add based, for example, on a variance of the values of the data points, a closeness of the fit of the previous approximation, and/or the determined error of the previous approximation.

When the selected function can no longer approximate the interval, segment, or time series within the maximum allowable error, the function module 114 may select another function from the plurality of available functions. The function module 114 may select another function by increasing a term, order, or degree of complexity of the at least one function, while still maintaining the same function type, or may select another function by selecting a function of a different type. For example, if the first selected function was a polynomial function, the second function may be a sinusoidal function.

The function module 114 may, for example, perform regression analysis on data within an interval, segment, or time series of the data to best approximate the data with a given degree of complexity or polynomial value. The function module 114 may, for example, perform a least-squares fit on the interval, segment, or time series of data, or may determine a function with the lowest maximum error between the function and the actual raw data value. The function module 114 may determine functions using a function type, such as a polynomial function, which may include constant value functions, straight line functions, and parabolic functions.

The function module 114 may increase a term, or number of parameters, of a same function type, when functions of a given term will no longer approximate an interval of data points within a maximum allowable error. For example, the function module 114 may determine constant value functions to approximate an interval while adding data points until the constant value functions can no longer approximate the intervals within the maximum allowable error. The function module 114 may then increase the term of the same function type (polynomial), and determine straight line functions to approximate the interval while adding data points until the straight line functions can no longer approximate the interval within the maximum allowable error. The function module 114 may then increase the term of the same function type (polynomial) and determine parabolic functions to approximate the interval while adding data points until the parabolic functions can no longer approximate the interval within the maximum allowable error. The function module 114 may continue increasing the term until reaching a maximum allowable term, order, degree, number of parameters, or complexity of the function type.

In an example of another function type (Fourier series), the function module 114 may perform a discrete Fourier transform on the data to determine a sinusoidal function within a given degree of complexity to approximate the data. The function module 114 may, for example, determine constant value functions to approximate an interval while adding data points until the constant value functions can no longer approximate the interval within the maximum allowable error. The function module 114 may then increase the term and determine functions with coefficients for an average value and sines and cosines of a first frequency while adding data points until the functions with the increased term can no longer approximate the interval within the maximum allowable error. The function module 114 may increase the term, thereby adding frequencies for sines and cosines in the function, to approximate intervals with additional data points within the maximum allowable error, up to the maximum term allowed by the parameter settings 112.

The error module 116 may determine an error of the function(s) determined by the function module 114. The error module 116 may determine whether the determined function approximates the interval, segment, or time series of data within the user-defined maximum error value. If the determined function does approximate the interval, segment, or time series of data within the user-defined maximum error value, then the function module 114 may add a new data value or data point to the interval, segment, or time series and determine a new function with the same complexity. If the determined function does not approximate the interval, segment, or time series of data within the user-defined maximum error value, then instead of adding a new data point, the function module 114 may find a function with the lowest error at the next level of complexity, such as the next higher polynomial order, up to the maximal complexity allowed by the parameter module 112, for the interval, segment, or time series.

In an example embodiment for compressing energy consumption measurements, the function module 114 and error module 116 of the parameter module 106 may determine a first type of function, polynomial approximations, of the raw data according to the following algorithm:

1: Let n be the maximum degree of the set of polynomials to be used as approximation modules
2: Let $S=<t_i, v_i>$ be the energy consumption time series
3: Let initial_index=1
4: Let current_index=initial index+1
5: while |S|>0 do
6:  current_segment=s[initial_index:current_index]
7:  for j [is included in the set] 1: n do
8:   while (polynomial of degree j fits) do
9:    current_index=current_index+1
10:   current_segment=s[initial index:current_index]
11:   computer_approximation(current_segment, polynomial$^j$)
12:  end while
13:  save_model(initial_index, current_segment, j)
14: end for
15: best_model=pick_best_polynomial_model( )
16: if best_model=0 then
17:  save_uncompressable_point(intial_index)
18:  initial_index=initial_index+1
19:  current_index=initial_index+1
20: else
21:  save(best_model)
22:  initial_index=get_end(pick_best_polynomial_model( ))+1
23:  current_index=initial_index+1
24: end if
25: end while In lines three to four, the function module 114 starts with an interval or segment of minimum length, two data points. The function module 114 begins the function type (polynomial) with the initial number of parameters, a polynomial of degree zero (or first order or one parameter), a constant value function, to fit the current interval or segment. In line eight, the error module 116 determines whether the data points in the current interval or segment fit the polynomial function within the allowable error. If the data points in the current interval or segment do fit the polynomial function within the allowable error, then in lines nine to eleven, the function module 114 adds new data points to the current interval or segment until the error module 116 determines that the current interval segment no longer fits the function type with the given term (or degree, order, or number of parameters) within the allowable error.

When the error module 116 determines that the current interval or segment no longer fits the polynomial function with the given term within the allowable error, the parameter module 106, at line thirteen, saves the beginning and end of the current interval or segment, such as the beginning and end times, and the term, degree, or order of the polynomial function. The parameter module 106 may also save the coefficients for the parameter(s), such as the average value, slope, or other parameters. Returning to line seven, the parameter module 106 repeats lines eight to twelve for the next term, which may be a more complex function or higher degree of polynomial, a straight line. The parameter module 106 thereby determines how many data points can fit into each term of the function type (polynomial), or each degree or order of polynomial, up to the maximum allowable term or polynomial degree (n).

Once the polynomial of highest term or degree (n) cannot fit the current interval or segment any longer within the maximum allowable error, the parameter module 106 stops trying to fit the current interval or segment. At line fifteen, the parameter module 106 determines the best, or most efficient, model of function or polynomial among the functions or polynomials up to the highest term or degree (n) used to fit the current interval or segment. The parameter module 106 may determine the best model of function or polynomial by determining which polynomial function most efficiently stores data.

In one example, the parameter module 106 may determine ratios of the number of data points in an interval or segment divided by the term, degree, or order of the polynomial for the interval or segment, and select the function/polynomial and interval or segment with the highest ratio. For example, if a first interval or segment included three points and fit into a polynomial function of term, degree, or order one (such as a constant value function), then the first interval or segment would have a ratio of three. If a second interval or segment included five points (which would include the three points that fit into the first interval or segment) and fit into a polynomial function of term, degree, or order two (such as a straight line function), then the second interval or segment would have a ratio of 2.5. Between the first and second intervals or segments, the parameter module 106 would select the first interval or segment because the first interval or segment had the higher ratio of data points to term or polynomial degree. If a third interval or segment included ten points (which would include the three points that fit into the first interval or segment as well as the remaining two points that fit into the second interval or segment), and fit into a polynomial of term, degree, or order three (such as a parabolic function), then the third interval or segment would have a ratio of 3.33. Between the first, second, and third intervals or segments, the parameter module would select the third interval or segment because the third interval or segment had the highest ratio of data points to term or polynomial degree. The parameter module 106 and/or settings module 104 may have rules for selecting an interval or segment where two or more intervals or segments and associated polynomials have equal ratios, such as selecting the interval or segment and associated polynomial function that fits the longer interval or segment (or includes more data points) or the polynomial function with the lowest maximum error. The parameter module 106 may also divide the data points by numbers other than the term, degree, or order to determine the ratio, such as a number of coefficients to be stored, or a number of coefficients plus additional overhead such as beginning and end points, function types, terms, according to example implementations. This ratio of data points to polynomial term, degree, or order is merely an example, and other types of compression ratio computation may be applied.

At line sixteen, if none of the functions of the given type, in this example polynomials, fit an interval or segment of points longer than the maximum allowable term, degree, or order of the polynomial function (or number of model parameters), then in line seventeen, the parameter module 106 saves the first data point in the interval or segment as "uncompressible", and in lines eighteen to nineteen, the parameter processor 106 starts the algorithm over with the following or second data point in the interval or segment.

If at least one of the functions (e.g. polynomials) does fit an interval or segment of points longer than the term, degree, or order of function (polynomial), then at line twenty-one the parameter module 106 saves the best model (determined by comparing the ratios), and at lines twenty-two to twenty-three the parameter module 106 starts the algorithm over with the point after or subsequent to the endpoint of the best model and/or compressed segment.

The data module 108 may store both the raw data 118 and compressed data 120. The data module 108 may provide the raw data 118 to the parameter module 106 in response to request(s) from the parameter module 106. As referenced above, such data streams are known to exist in a variety of circumstances and settings, including, for example, business, industry, healthcare, government, or military settings. To give just a few, more specific, examples, the data sources may output data streams representing or related to (events occurring within or with respect to) network monitoring, network traffic engineering, telecom call records, financial applications, stock market data, sensor networks, manufacturing processes, web logs and click streams, and massive datasets which are streamed as a way of handling the large volume of data. Such data streams may thus arise in enterprises, within and across government agencies, large science-related corroborations, libraries, battlefields, or "smart" homes.

The data module 108 may also receive and store the compressed data 120 received from the parameter module 106. The compressed data 120 may include segments 122, such as beginning and/or end points of segments, intervals, or time series. The compressed data 120 may also include parameters 124 for each of the intervals or segments, such as coefficients, function type identifiers, and/or function terms. The compressed data 120 may also include identifiers for the intervals or segments and/or functions.

The computing system 100 may include a decompressor module 126. The decompressor module 126 may decompress compressed data. The computing system 100 may receive compressed data from another device. Or, the computing system 100 may decompress data which was previously compressed by the computing system 100.

The decompressor 126 may decompress data to estimate point values of data, or estimate total values over intervals, such as power usage over a time interval. A point estimator 128 of the decompressor 126 may estimate or approximate point values, and an area estimator 130 of the decompressor estimate or approximate areas such as power usage over a time period.

The point estimator 128 may determine the data value at a certain point, such as a certain point in time. The point estimator 128 may determine the function for the interval, segment, or time series of the independent variable (such as time), as well as the parameters or coefficients. The point estimator 128 may then insert the value of the independent variable into the function, along with the parameters and/or coefficients, to determine the value of the dependent variable.

According to an example, the point estimator 128 may determine point values for the independent variable $t_q$ (which may represent time) according to the following algorithm:

1: $t_q$ has to be in the range of the compressed data, but it does not necessarily need to be a point which has been contained in the original data.
2: Accesses the interval in the compressed data containing $t_q$.
3: Insert the parameters associated with the interval into the function associated with it, and calculate the value y of this function at point $t_q$.
4: Return y.

The area estimator 130 may determine an area or sum of values from the compressed data. The area estimator may determine the function(s) for the interval(s), segment(s), or time series of the independent variable (such as time) at the points where an area or sum is desired, as well as the parameters or coefficients. The area estimator may then integrate to determine the area under these points. The integration may be performed either analytically, using the functions, or numerically, multiplying point values by the width or intervals between point values.

According to an example, the area estimator 130 may determine the area or sum of values for the compressed data within an interval between $t_1$ and $t_2$ (which may represent a time interval) according to the following algorithm:

1: $t_1$ and $t_2$ have to be in the range of the compressed data, but they do not necessarily need to be points which have been contained in the original data.
2: Accesses all intervals I in the compressed data which are between $t_1$ and $t_2$.
3: for j=1 to |I| do
4: Insert the parameters associated with interval $I_j$ in the function associated with it, integrate the resulting function and calculate the value $A_j$ of this function for the whole (in case I is completely between $t_1$ and $t_2$) or partial part of the interval (in case $t_1$ or $t_2$ are inside I).
5: $A=A+A_j$
6: end for
7: Return A.

The computing system 100 may include at least one processor 132. The at least one processor 132 may be capable of executing instructions and performing calculations to execute the processes and functions described herein. The at least one processor 132 may include one or more general purpose processors, such as an x86 processor, an ARM processor(s), or a MIPS processor(s), or may include an application-specific integrated circuit(s) (ASIC) designed to perform the processes and functions described herein.

The computing system 100 may also include a memory 134. The memory 134 may include any form of volatile or non-volatile memory. The memory 134 may include instructions 136 for execution by the processor 132. The memory 134 may include, for example, at least one non-transitory computer-readable storage medium comprising instructions stored thereon that, when executed by the at least one processor 132, are configured to cause the computing system 100 to perform any combination of the functions and processes described herein. The memory 134 may also include data 138. The data 138 may include the settings 104, raw data 118, the compressed data 120, intermediary data used to perform calculations, data including identities of receiving and/or sending devices with which the computing system 100 may communicate, or any other data stored by the computing system 100.

The computing system 100 may also include input and output nodes 140, 142. The input and output nodes 140, 142 may be separate nodes, or may be combined into a single node. The input and output nodes 140, 142 may each include multiple interfaces. For example, the input node 140 may include a keyboard and mouse for user input, and may include a wired or wireless communication interface for receiving signals from one or multiple computing devices. The output node 142 may include a display or monitor as well as a wired or wireless communication interface for sending signals to one or multiple computing devices.

Figure 2A:
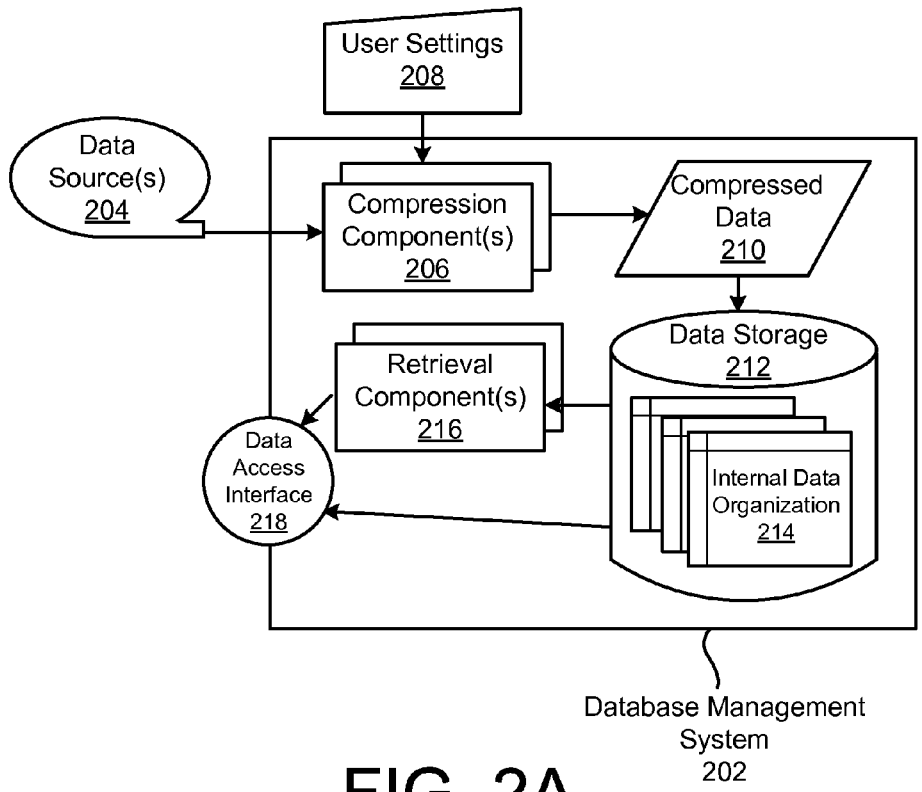
FIG. 2A is a diagram of a database management system according to an example implementation.

FIG. 2A is a diagram of a database management system 202 according to an example implementation. The database management system 202 may include a relational database management system, and may perform compression and/or decompression functions as described above with respect to FIG. 1.

An external data source 204, such as an electricity meter, may provide time-series data for compression to the database management system 202. A compression component 206 of the database management system 202 may compress the time-series data received from the data source 204. The compression component 206 may compress the data in accordance with user settings 208 inputted by a user or administrator of the database management system 202. The compression component 206 may compress the data in accordance with functions and processes described herein. The compression component 206 may provide the compressed data 210 to a data storage unit 212 of the database management system 202. The data storage unit 212 may use an internal data organization 214, such as a relational table schema, to store the compressed data 210. The relational table schema may be customized, such for further data-agnostic compressed storage and/or quick access.

A retrieval component 216 of the database management system 202 may access the compressed data from the data storage unit 212. The retrieval component 216 may decompress the compressed data to approximate the original data. The retrieval component 216 may decompress the compressed data in accordance with functions and processes described herein. The database management system 202 may include a data access interface 218 which communicates with external devices and/or applications. The data access interface 218 may provide the decompressed and/or approximated data to the external devices and/or applications. The retrieval component 216 may provide the decompressed and/or approximated data to the external devices and/or applications as a mediating service or direct access to the database management system 202 using general purpose interfaces, such as Structured Query Language (SQL), or customized interfaces. The components and functions of the database management system may be included in and performed by a single computing device or server, or may be distributed over multiple computing devices or servers, which may be in a single or multiple locations and may work in parallel.

The functions and processes described herein may also be performed in an embedded device, such as a smart electricity meter. A smart meter may communicate as few data as needed for billing to an electricity provider, while also storing high-resolution measurement data. The high-resolution measurement data may be compressed, and may be visualized, such as in a browser in a local network. The high-resolution measurement data may enable a user to explore different views of the data, such as via a web application, which may be included on a mobile device.

Figure 2B:
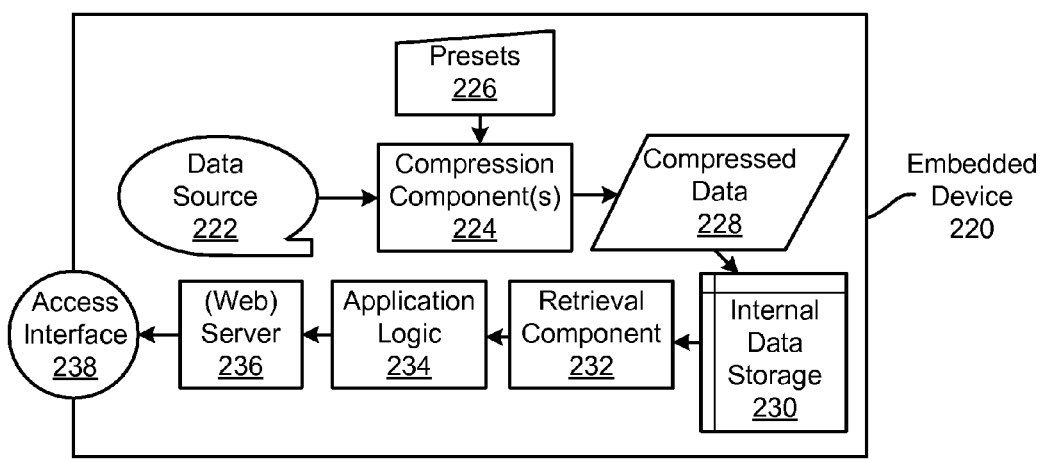
FIG. 2B is a diagram of an embedded device according to an example implementation.

FIG. 2B is a diagram of an embedded device 220 according to an example implementation. The embedded device 220 may be included in a measurement device, such as an electricity meter. A data source 222 may be internal or external to the embedded device 220. The data source 222 may receive and/or store raw, uncompressed data, such as measurements by a measurement device such as electricity usage. The data source 222 may provide the data to a compression component 224. The compression component 224 may compress the data received from the data source 222. The compression component 224 may compress the data in accordance with functions and processes described herein. The compression component 224 may compress the data in accordance with presets 226 stored in the embedded device 220. The presets 226 may include user settings such as a maximum allowable error and/or a maximum complexity, order, or degree for functions used to compress the data. The presets 226 may be coded into the embedded device 220, or may be received from a user via another application.

The compression component 224 may compress the data received from the data source 222 into compressed data 228, and store the compressed data 228 in internal data storage 230. The internal data storage 230 may include, for example, flash memory, and may be stored as flat files. The embedded device 220 may include a retrieval component 232. The retrieval component 232 may access the compressed data 228 from the internal data storage 230. The retrieval component 232 may decompress the compressed data 228 and/or approximate the original data. The retrieval component 232 may decompress the compressed data 228 and/or approximate the original data in accordance with functions and processes described herein. The form of the data retrieved by the retrieval component 232 may include, for example, a set of values or data points, or a structured reply such as Extensible Markup Language (XML) code or a graph. An application logic 234 may query the decompressed and/or approximated data from the retrieval component 232. The retrieval component 232 may decompress the compressed data 228 "just in time," or at the time of the query from the application logic 234. The retrieval component 232 may provide the data (which has been decompressed and/or approximated) to the application logic 234. The application logic 234 may deliver the decompressed and/or approximated data to a user, such as via a server 236, which may include a web server, over a data access interface 238. The application logic 234 may, for example, execute on an application server which may co-host a web server.

Figure 2C:
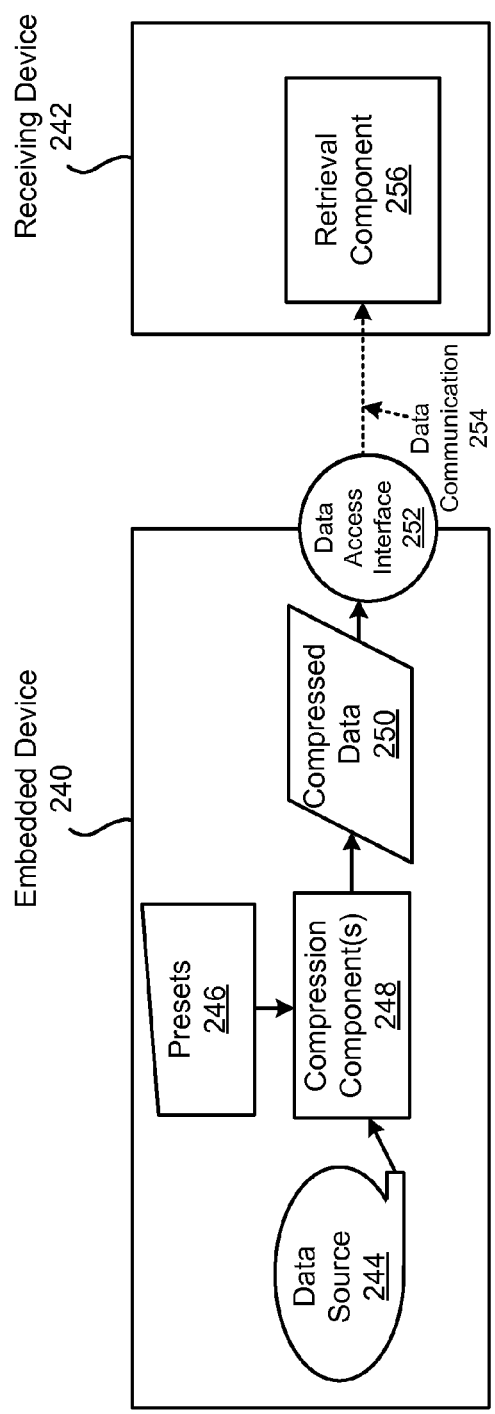
FIG. 2C is a diagram showing an embedded device and a receiving device according to an example implementation.

FIG. 2C is a diagram showing an embedded device 240 and a receiving device 242 according to an example implementation. The embedded device 240 may have similar features and functions to the embedded device 220 described with respect to FIG. 2B. The embedded device 240 may include a data source 244. The data source 222 may receive and/or store raw, uncompressed data, such as measurements by a measurement device of which the embedded device 240 is a component. The data source 244 may provide the data to a compression component 248. The compression component 248 may compress the data received from the data source 244 in accordance with functions and processes described herein. The compression component 248 may compress the data in accordance with presets 246 stored in the embedded device 240. The presets 246 may include, for example, a maximum allowable error value, and/or maximum complexity of functions used to compress and/or approximate the data.

The embedded device 240 may provide the compressed data 250 to the receiving device 242. The embedded device 240 may provide the compressed data 250 to the receiving device 242 via a data access interface 252. The data access interface 252 may include, for example, a wired or wireless communication node capable of data communication 254 to provide the compressed data 250 to the receiving device 242. The receiving device 242 may receive the compressed data 250. The receiving device 242 may include a retrieval component 256. The retrieval component 256 may decompress the compressed data 250 and/or approximate the original data using any of the functions or processes described herein.

Figure 3:
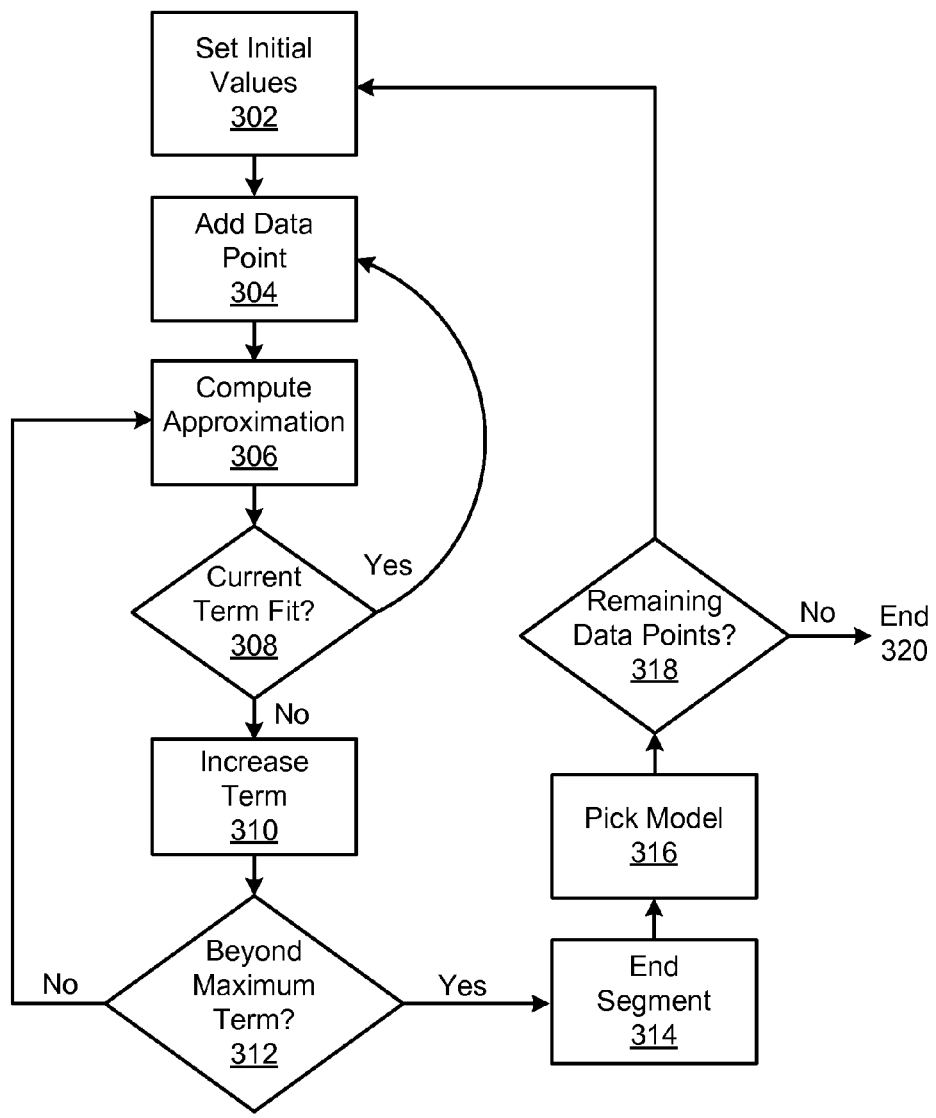
FIG. 3 is a flowchart of a method for compressing data according to an example implementation.

FIG. 3 is a flowchart of a method for compressing data according to an example implementation. This method may use a multi-model approach for piecewise regression. The compression may result in a list of intervals or segments. Each of the intervals or segments may be associated with a mathematical function. The functions may approximate the values of the data points of the intervals or segment within a user-specified error bound. The compression may result in a solution with a multi-segment mathematical formula H(t):

$$H(t) = \begin{cases} h_1(t) & t \in [t_0, t_1] \\ h_2(t) & t \in [t_1, t_2] \\ \ldots \\ h_N(t) & t \in [t_{N-2}, t_N] \end{cases}$$

t may be an independent variable, and may correspond to a time at which measurements for the data points were taken, and $h_i$ may be an instantiation of a regression function. The regression functions in an example in which the function type is polynomial may include:
Constant value functions of the form f(t)=c
Straight line functions of the form f(t)=a·t+b
Polynomials of degree k≥2, of the form $f(t)=a_k \cdot t^k + a_{k-1} \cdot t^{k-1} + \ldots + a_1 \cdot t + a_0$ The method for compressing data may include setting initial values (302). The initial values may include a maximum allowable error, a maximum term, order, or degree for the functions (such as polynomial functions) used to approximate the data, and a first data point for the segment, interval, or time series. The initial values may also include a complexity level, such as an order or degree of polynomial. The complexity level may increase and be reset during the compressing, as described below.

The method may include adding a data point (304) to the segment, interval, or time series. The added data point may be a next data point in the set of data.

The method may include computing an approximation (306) of the segment, interval, or time series. The approximation may be a function computed according to a given term of complexity, such as a given polynomial function with unknown coefficients. The term of complexity may be incrementally increased as described below with respect to (312) and (306) and then returned to an initial and/or minimal complexity as described below with respect to (318) and (302).

The approximation may be computed to minimize a maximum error or deviation between the actual values and the values indicated by the approximation function. For example, if the function is a constant value function, then the approximation may be a single value (c as described above that best approximates the segment, interval, or time series. If the function is a straight line function, then the approximation may include determining parameters (a and b as described above) that define a line best approximating the segment, interval, or time series. If the function is a polynomial of degree k≥2, then the approximation may include determining parameters ($a_k$, $a_{k-1}$, ... $a_1$, $a_0$ as described above) that best describe the segment, interval, or time series.

After the approximation has been computed, the method may include determining whether the current term, order, or degree of function used to perform the approximation fits (308) within a maximum allowable error. The determination of whether the current term, order, or degree of approximation fits may be made by comparing each data point to the approximation of the respective data point, and determining whether the difference is within the allowable error. If every data point is approximated within the allowable error, then the current degree of approximation will be determined to fit the current segment, interval, or time series, and the method will include adding a new (subsequent) data point (304), computing an approximation (306) for the segment, interval, or time series that includes the new data point with the same term, degree, or order of complexity, and determining whether the approximation fits (308).

If at least one of the data points is not approximated by a function with a given term of complexity within the allowable error, then the term, order, or degree complexity of the function used to approximate the interval or segment may be increased (310). The data points that did fit into the function before the increase in term of complexity may also be stored, and the parameters or coefficients used to fit the data points before the increase in term of complexity may also be stored. The term of complexity may be increased from a constant value function to a straight line function, from a straight line function to a polynomial, or from a polynomial to a polynomial of the next higher degree (e.g., from two to three, three to four, or four to five). The method may include determining whether the increase in term, order, or degree complexity brings the function beyond the maximum term (312). If the increase in term, order, or degree of complexity does not bring the function beyond the maximum term of complexity, then an approximation of the segment, interval, or time series may be computed (306) with the newly increased term, order, or degree of complexity.

If the increase in term, order, or degree of complexity does bring the function beyond the maximum term, order, or degree of complexity, then the interval or segment may be ended (314). With the interval or segment ended, the method may include picking the best model (316) for approximating the data points. The best model may be picked as described above. The best model, including beginning and end points and parameters for describing the function, may be stored.

After the best model has been picked (316), the method may include determining whether any data points remain (318). Remaining data points may include any data points after the end point of the best model picked in (316). If no data points remain, then the method may end (320). If data points do remain, then initial values, such as the term, degree, or order of complexity, may be set (302). The initial values may also include the next data point after the end point or last data point in the last interval or segment of the last model. The term, degree, or order of complexity may be set to the lowest value, such as the straight line function. The method may continue by adding data points (304) to approximate the remaining points in the data set.

Figure 4A:
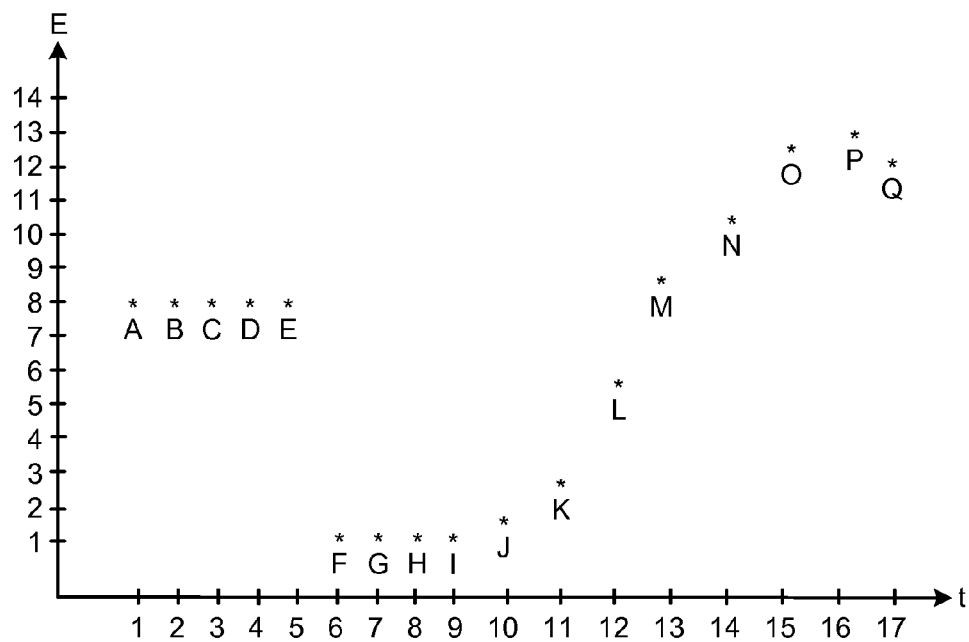
FIGS. 4A through 4O show an example of a graph of data and regression analyses used to approximate the data.
Figure 4B:
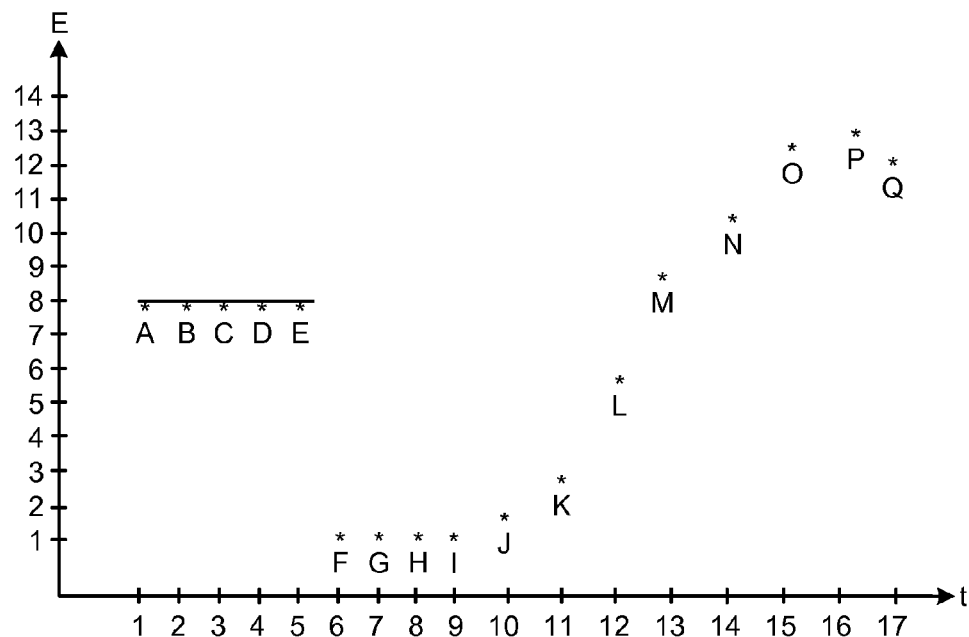
Figure 4C:
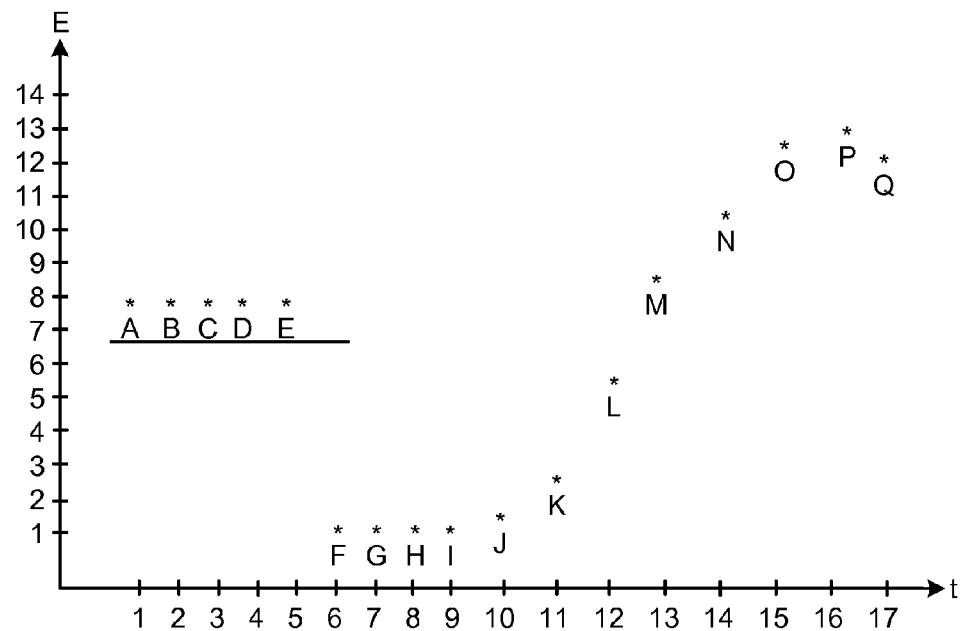
Figure 4D:
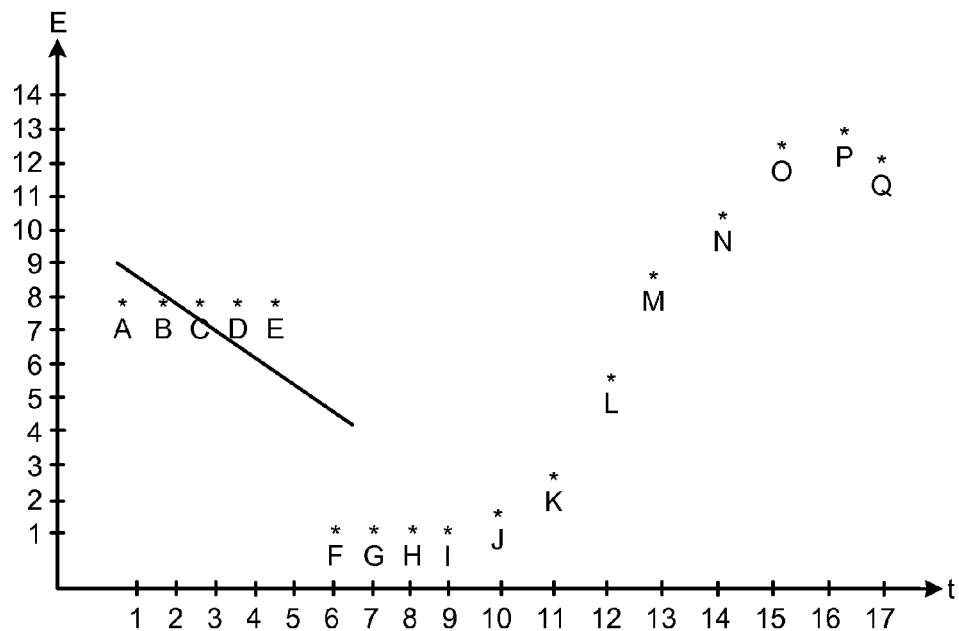
Figure 4E:
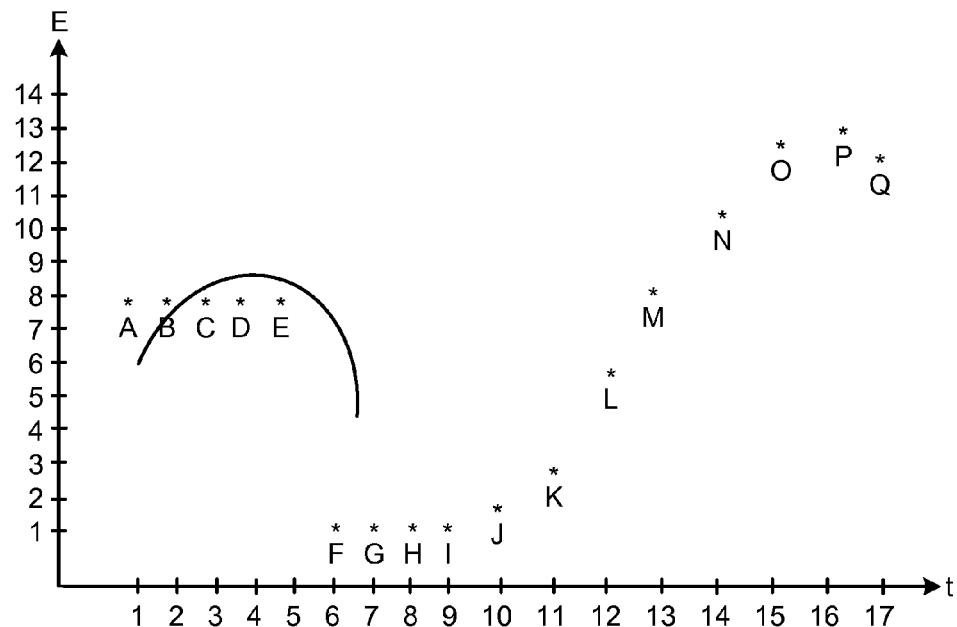
Figure 4F:
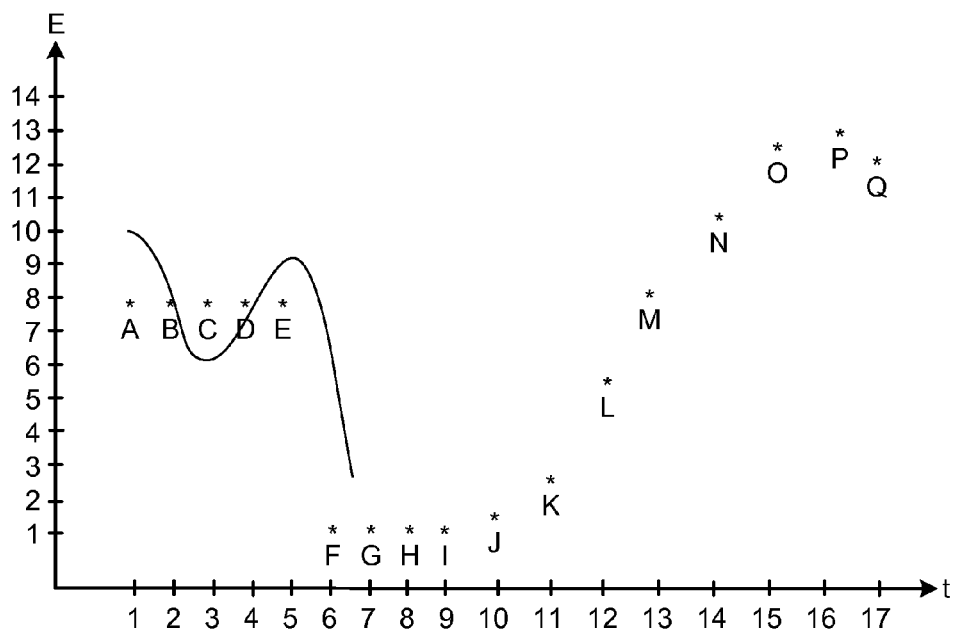
Figure 4G:
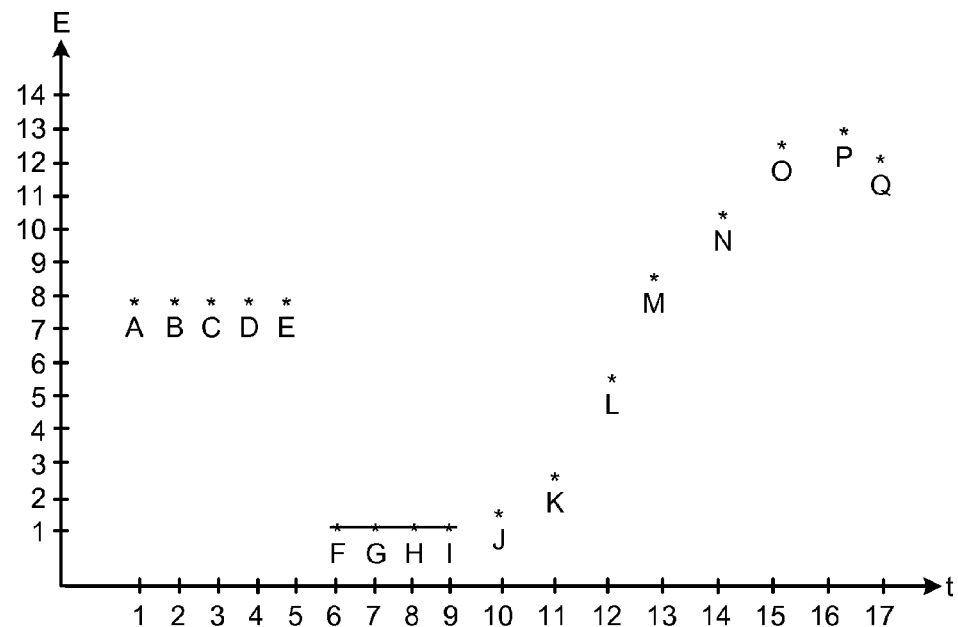
Figure 4H:
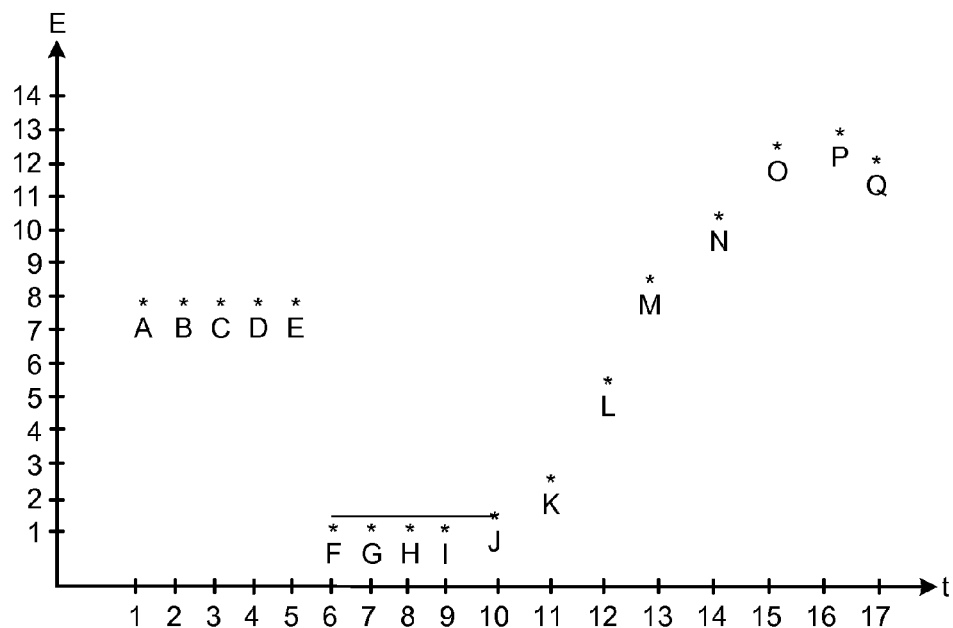
Figure 4I:
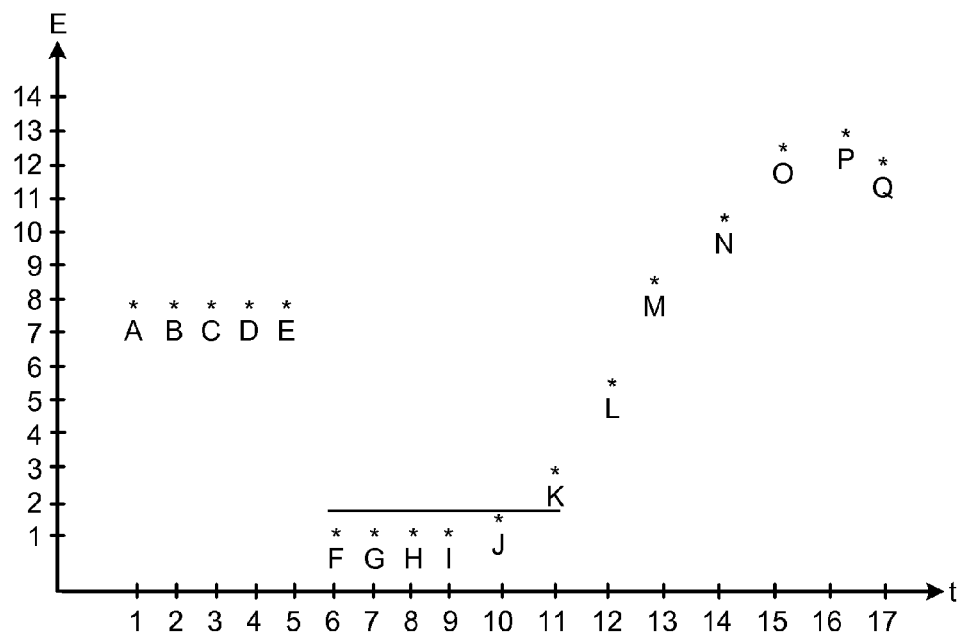
Figure 4J:
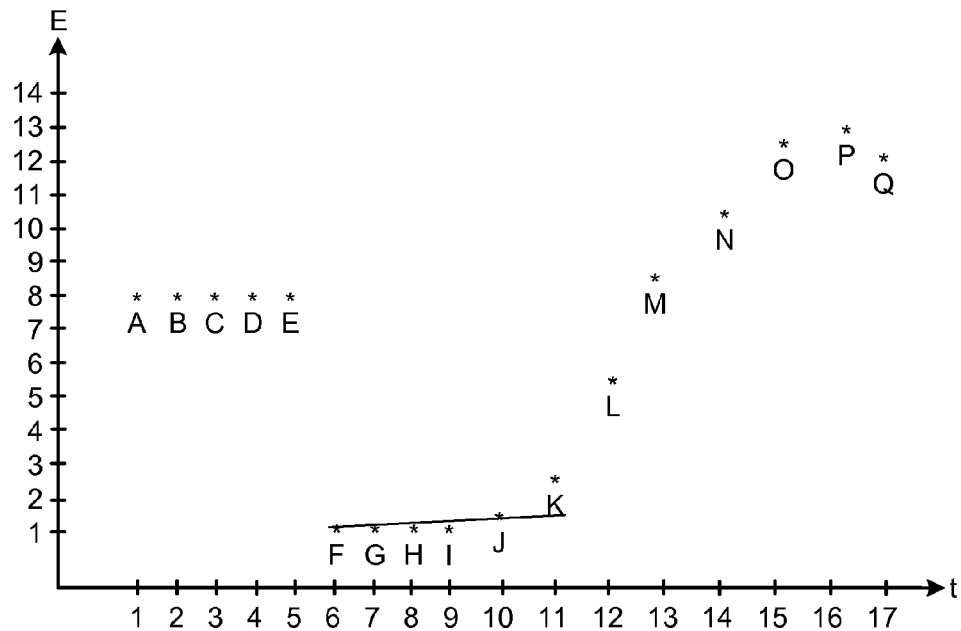
Figure 4K:
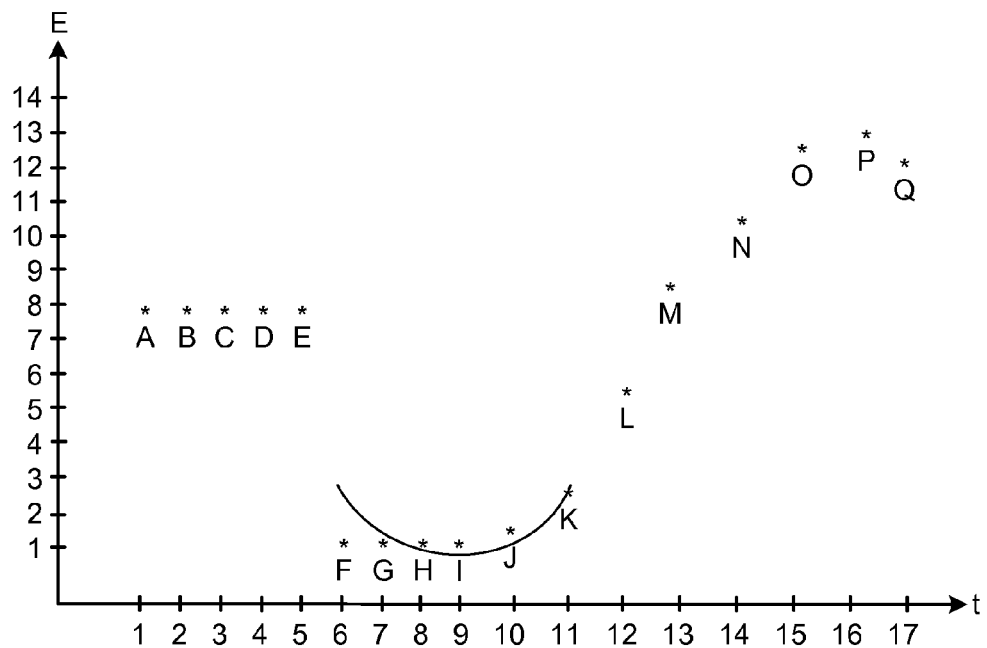
Figure 4L:
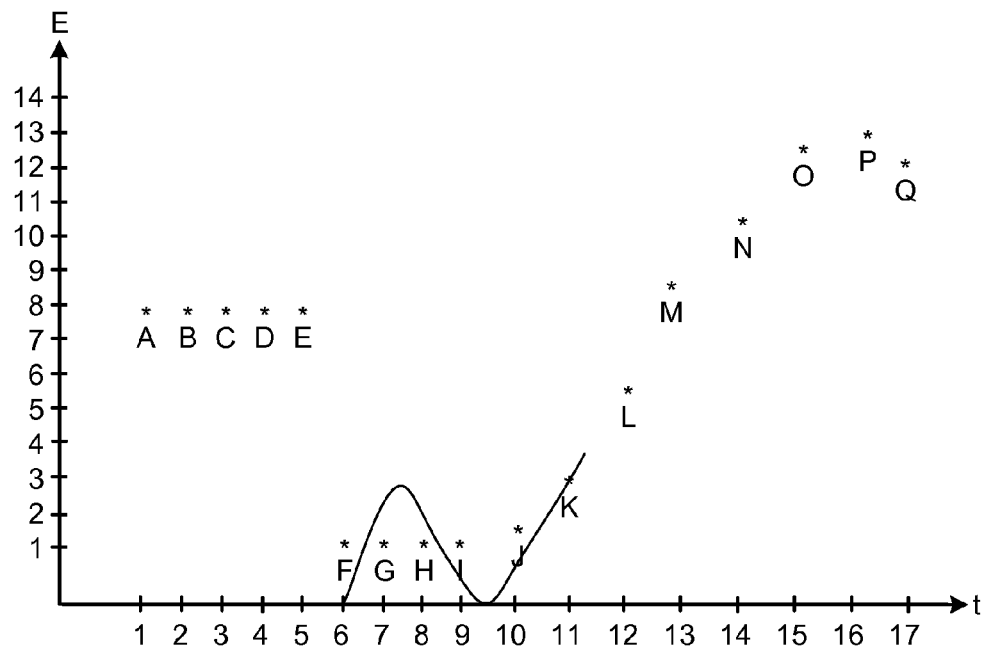
Figure 4M:
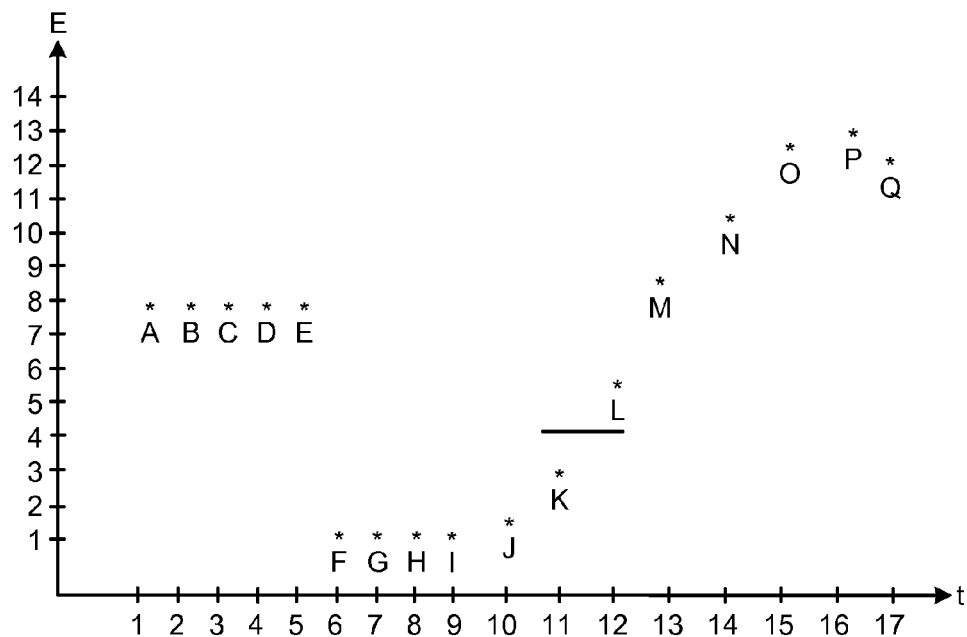
Figure 4N:
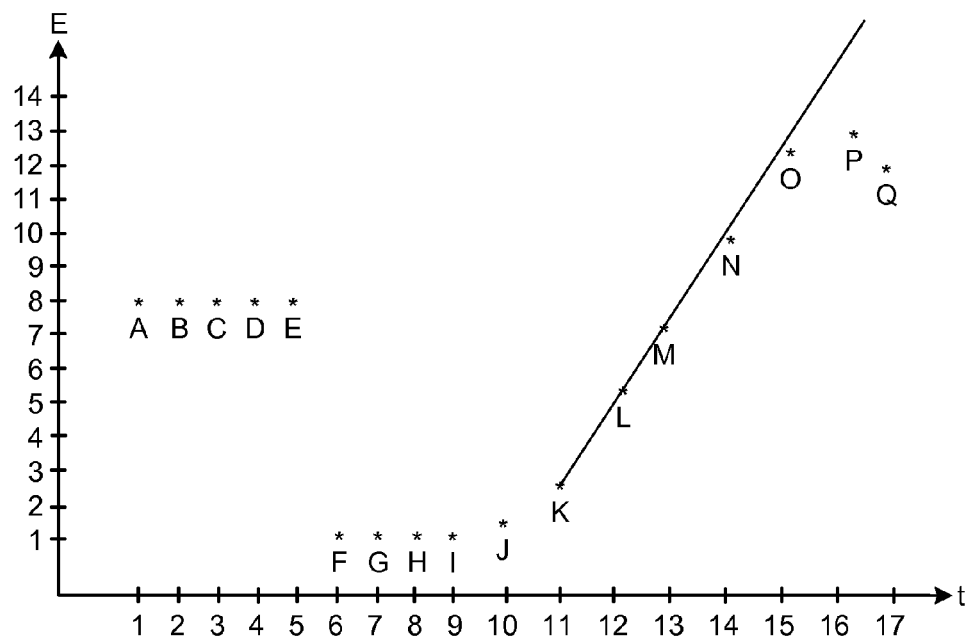
Figure 4O:
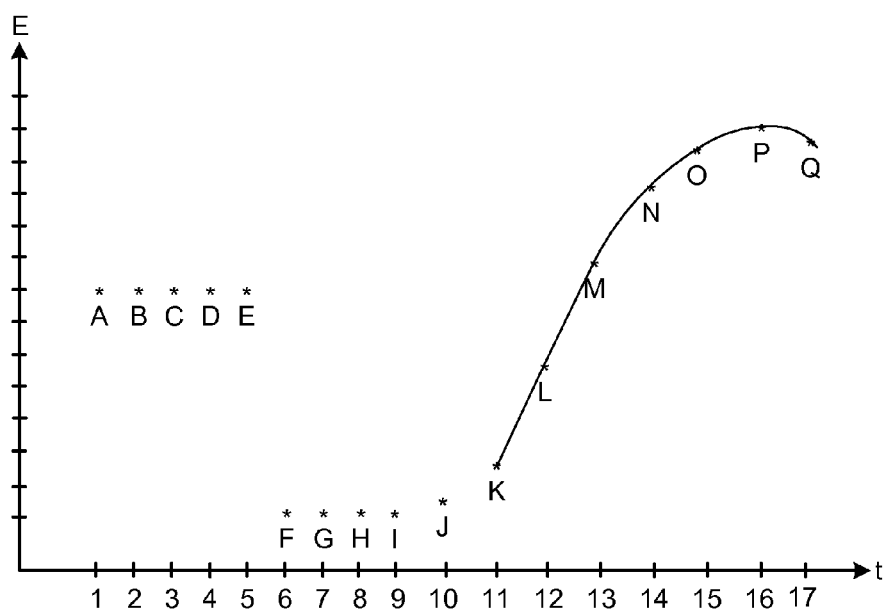

FIGS. 4A through 4O show an example of a graph of data and regression analyses used to approximate the data. FIG. 4A shows a graph of energy use as a function of time. In this example, seventeen data points, A through Q, are shown, representing energy consumption from time 1 to time 17. While seventeen data points are shown in FIG. 4A, many more data points could be included in a data set. While functions of the type polynomial are used in this example, other function types, such as sinusoidal, exponential, logarithmic, or asymptotic, may also be used to approximate and compress data.

In this example, the first five measurements, A through E, indicate approximately the same energy consumption. A customer may have been using the same amount of energy during this time period. The next four measurements, F through I, show measurements that are approximately the same as each other, but significantly lower than the first five measurements. The customer may have left his or her house and turned most of the appliances, including an electric heater, off. The next eight measurements, J through Q, show measurements with a sinusoidal or parabolic pattern, in which the energy usage increases, levels off, and then begins to decrease. This may indicate that the customer was using electricity to maintain a constant temperature in the home, with more electricity required to maintain the constant temperature at night when the outside temperature is colder and less electricity required to maintain the constant temperature during the day when the outside temperature is warmer.

FIG. 4B is a graph showing an approximation of the segment, interval, or time series that includes the first five data points, A through E. In this example, an initial term of complexity of the polynomial function type, such as a first- or lowest-order, constant value approximation was performed, approximating the values of the five data points A through E as eight. The first-order, constant value approximation may have been performed and determined to fit within the maximum allowable error, for the segments, intervals, or time series that includes the two data points A and B, three data points A through C, four data points A through D, and five data points A through E. As the approximation of the data points in the segment, interval, or time series that includes A through E was found to fit, the subsequent data point F may have been added to the segment, interval, or time series. The lowest degree polynomial, the first-order constant value function, fits, so a sixth data point, F, will be added to the segment, interval, or time series.

FIG. 4C is a graph showing an approximation of the segment, interval, or time series that includes the first six data points, A through F. In this example, a lowest-order, constant value approximation of the function type polynomial was again performed. In this example, the constant value of six-and-one-half does not approximate all of the data points A through F included in the current segment, interval, or time series within the maximum allowable error. Specifically, the data point F cannot be fitted into the constant value function within the maximum allowable error while also approximating the values of data points A through E. Because the constant value function does not approximate all of the data points A through F, a function of greater complexity will be fitted to the segment, interval, or time series.

FIG. 4D is a graph showing another approximation of the segment, interval, or time series that includes the first six data points, A through F. In this example, the term was increased for the function type polynomial, and a second-order, straight-line approximation was performed. In this example, no straight-line function can approximate all of the data points A through F within the maximum allowable error. Specifically, the data point F cannot be fitted into the straight line function within the maximum allowable error while also approximating the values of data points A through E. Because the straight line function does not approximate all of the data points A through F, a function of greater complexity will be fitted to the segment, interval, or time series.

FIG. 4E is a graph showing another approximation of the segment, interval, or time series that includes the first six data points, A through F. In this example, the term was again increased for the function type polynomial, and a third-order, polynomial (parabolic) approximation was performed. In this example, no parabolic function can approximate all of the data points A through F within the maximum allowable error. Specifically, the data point F cannot be fitted into the parabolic function within the maximum allowable error while also approximating the values of data points A through E. Because the parabolic function does not approximate all if the data points A through F, a function of greater term of complexity will be fitted to the segment, interval, or time series.

FIG. 4F is a graph showing another approximation of the segment, interval, or time series that includes the first six data points, A through F. In this example, the term of the function type polynomial was again increased, and a fourth-order, polynomial approximation was performed. In this example, no fourth-order, polynomial function can approximate all of the data points A through F within the maximum allowable error. In this example, the fourth-order polynomial is the highest order, or greatest complexity, function allowable.

Because no function of any allowable term, order, or degree of complexity was able to approximate all of the data points A through F, this segment, interval, or time series will not be used. Instead, the segment, interval, or time series that included data points A through E will be used. The constant value function for approximating data points A through E will be saved. The parameters for approximating data points A through E, including the beginning point A and end point E, will be saved, as well as the constant value eight, the function type polynomial, and/or the function term indicating that the function was a constant value function.

FIG. 4G is a graph showing an approximation of a segment, interval, or time series that includes four data points, F through I. In this example, the function type polynomial with the initial or lowest term, order, or degree of complexity was used, and a first-order, constant value approximation was performed, approximating the values of the four data points F through I as eight. The first-order, constant value function may have been performed, and determined to fit within the maximum allowable error, segments, intervals, or time series that include the two data points F and G, three data points F through H, and four data points F through I. The lowest degree polynomial, the first-order constant value function, fits, so a fifth data point, J, will be added to the segment, interval, or time series.

FIG. 4H is a graph showing an approximation of a segment, interval, or time series that includes five data points, F through J. In this example, the function type polynomial with the initial or lowest term, order, or degree of complexity was again used, and a first-order, constant value approximation was performed, approximating all of the data points F through J within the maximum allowable error. Because the lowest term, order, or degree of complexity for the function type polynomial, the first-order constant value function, fits, a sixth data point, K, will be added to the segment, interval, or time series.

FIG. 4I is a graph showing an approximation of a segment, interval, or time series that includes six data points, F through K. In this example, the function type polynomial with the initial or lowest term, order, or degree of complexity was again used, and a first-order, constant value approximation was performed, approximating all six of the data points F through K in the segment, interval, or time series. In this example, not all of the data points could be approximated by the first-order constant value approximation within the maximum allowable error. Specifically, the data point K was not approximated within the maximum allowable error.

Because the first-order, constant value approximation could not approximate all of the data points F through K within the allowable margin of error, the term, order, or degree of complexity of the function type will be increased, and the function type with the increased term, order, or degree of complexity will be fitted to the segment, interval, or time series. The segment, interval, or time series that includes the five points F through J, for which the first-order, constant value approximation did fit within the allowable margin of error, will be saved. The beginning and end points, F and J at times six and ten, respectively, will be saved, as will a description of the constant value function and the value.

FIG. 4J is a graph showing an approximation of the segment, interval, or time series that includes the six data points, F through K. In this example, the term, order, or degree of complexity of the function type polynomial was increased, and a second-order, straight line function was performed, approximating all six of the data points F through K in the segment, interval, or time series. In this example, not all of the data points could be approximated by the second-order straight line approximation within the maximum allowable error. Specifically, data point K was not approximated within the maximum allowable error. Because the second-order, straight line approximation could not approximate all of the data points F through K within the allowable margin of error, a function of greater complexity will be fitted to the segment, interval, or time series.

FIG. 4K is a graph showing an approximation of the segment, interval, or time series that includes the six data points, F through K. In this example, the term, order, or degree of complexity of the function type polynomial was increased again, and a third-order, parabolic function was performed, approximating all six of the data points F through K in the segment, interval, or time series. In this example, not all of the data points could be approximated by the third-order parabolic approximation within the maximum allowable error. Specifically, data point F was not approximated within the maximum allowable error. Because the third-order, parabolic approximation could not approximate all of the data points F through K within the allowable margin of error, a function of greater complexity will be fitted to the segment, interval, or time series.

FIG. 4L is a graph showing an approximation of the segment, interval, or time series that includes the six data points, F through K. In this example, the term, order, or degree of complexity of the function type polynomial was increased again, and a fourth-order polynomial function was performed, approximating all six of the data points F through K in the segment, interval, or time series. In this example, not all of the data points could be approximated by the fourth-order polynomial approximation within the maximum allowable error. Specifically, data point G was not approximated within the maximum allowable error.

In this example, the user settings dictated that the fourth-order polynomial is the highest allowable term, order, or degree of complexity for the function type polynomial. Because the fourth-order polynomial approximation could not approximate all of the data points F through K within the allowable margin of error, and the fourth-order polynomial function is the highest allowable degree of complexity, no further attempts will be made to approximate the segment, interval, or time series that includes the six data points, F through K. Instead, the segment, interval, or time series that includes the five data points, F through J will be saved, and a new segment, interval, or time series beginning with data point K will be approximated. The new segment, interval, or time series will be approximated using the least complex function, in this example a first-order constant value function.

FIG. 4M is a graph showing an approximation of a segment, interval, or time series that includes the two data points, K and L. In this example, the function type polynomial with the initial or lowest term, order, or degree of complexity was used, and a first-order constant value function was used to approximate the data points K and L. In this example, the first-order constant value function could not approximate the data points K and L within the maximum allowable error. Because the first-order constant value function could not approximate the data points K and L within the maximum allowable error, a function of the next higher level of complexity, a second-order straight line function, will be used to approximate the segment, interval, or time series that includes the two data points, K and L.

FIG. 4N is a graph showing an approximation of a segment, interval, or time series that includes five data points K through O. In this example, the term, order, or degree of complexity of the function type polynomial was increased, and a second-order, straight line approximation was performed, approximating the values of the five data points K through P. The second-order, straight line function may have been performed, and determined to fit within the maximum allowable error, segments, intervals, or time series that include the two data points K and L, three data points K through M, four data points K through N, and five data points K through O. Based on each of these fits within the maximum allowable error, the next data point may have been added to the segment, interval, or time series.

However, the sixth data point, P, may not fit into the second-order, straight line approximation within the maximum allowable error. Because the sixth data point, P, does not fit into the second-order, straight line approximation within the maximum allowable error, the second-order, straight line approximation for the segment, interval, or time series that approximates the five data points K through O within the maximum allowable error may be saved. The segment, interval, or time series that includes the six data points K through P may be approximated by the function of next higher complexity, a third-order parabolic function.

FIG. 4O is a graph showing an approximation of a segment, interval, or time series that includes seven data points K through Q. In this example, the term, order, or degree of complexity of the function type polynomial was again increased, and a third-order, parabolic function was performed, approximating the values of the seven data points K through Q. The third-order, parabolic approximation may have been determined to fit the segment, interval, or time series that includes six data points K through P within the allowable margin of error. Based on the determination that the third-order, parabolic approximation fits the segment, interval, or time series within the allowable margin of error, the next data point, Q, may have been added to the segment, interval, or time series. The third-order, parabolic approximation may be determined to fit the segment, interval, or time series that includes the seven data points K through Q within the allowable margin of error.

If no further data points remain, then the function describing the six data points K through Q may be saved. The beginning and end points K and Q may be saved, as well as coefficients for the third-order parabolic function, the function type polynomial, and/or the term, order, or degree of complexity (which may indicate third order parabolic). If further data points, not shown in the figures, remain, then the data points may be added to the segment, interval, or time series, and a third-order, parabolic function may be approximated on the new segment, interval, or time series.

The computing system 100 may determine ratios for the two segments, intervals, or time series that respectively include K through N and K through Q, as described above. The ratios described herein are merely examples, and the computing system 100 may determine functions for each segment, interval, or time series to assess and/or determine the compression ratio. The first segment includes four data points K through N with a polynomial order of two for the straight line function, for a ratio of (four/two) two. The second segment includes seven data points K through Q with a polynomial order of three four the parabolic function, for a ratio of (seven/three) two-and-one-third. Because the ratio of the second segment is greater than the ratio of the first segment, the computing system 100 may select the second segment.

Figure 5A:
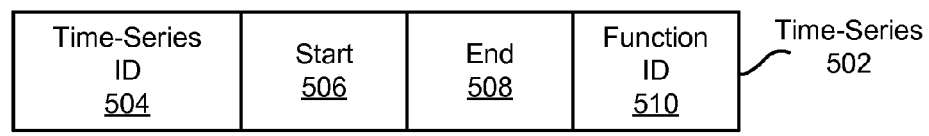
FIG. 5A shows a database schema for time-series according to an example implementation.

FIG. 5A shows a database schema for time-series according to an example implementation. The segments, intervals, or time series may be stored and/or saved using the objects and/or fields shown and described with respect to FIGS. 5A, 5B, and 5C. A time-series 502, or set of data, may be stored with the fields shown in FIG. 5A. The time-series 502 may include a time-series ID field 504 that identifies the time series, such as by identifying a device that performed the measurements. The time-series 502 may also include an interval or segment definition including a start time field 506 and end time field 508. The time-series 502 may also include a function identifier field 510 that refers to an associated function, described with respect to FIG. 5B.

Figure 5B:
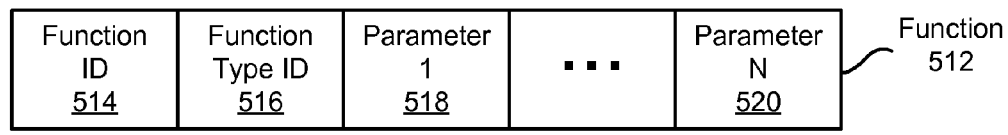
FIG. 5B shows a database schema for functions according to an example implementation.

FIG. 5B shows a database schema for functions according to an example implementation. A function 512 may include a function ID field 514 identifying the function, which may match to the function ID 510 included in a time series 502 associated with the function 512. The function 512 may include a function type ID field 516 that references a type of the function and indicates the number of parameters of the function. The type of the function may include, for example, a polynomial function, a sinusoidal (such as Fourier series) function, an exponential function, a logarithmic function, or an asymptotic function. The function 512 may also include a number of parameters 518, 520 1 . . . N identified by the function type ID field 516. In the example of a function of type polynomial, the parameters 518, 520 may be coefficients for a polynomial functions, slope and intercept for a straight line function, or the constant value of a constant value function. In an example of a function type sinusoidal, the parameters 518, 520 may include an average value and coefficients for sines and cosines of different frequencies.

Figure 5C:
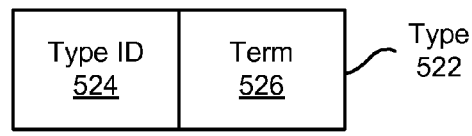
FIG. 5C shows database schema for types according to an example implementation.

FIG. 5C shows database scheme for types according to an example implementation. A type 522 may include a type ID field 524 identifying a type of the function, which may be referenced by the function type ID field 516 of the function 512. The type 522 may also include a term field 526 that describes the function, for example, 'p_1·t$^2$+p_2·t+p_3'. The term field 526 may store the function term, including coefficients and variables of different powers, such as 'p_1·t$^2$+p_2·t+p_3'. In another example, the term field 526 may indicate the term, order, or degree of complexity of the function. The term field 526 may, for example, indicate the number of terms in a function of type polynomial. In this example, the term field 526 may store a '0' or '1' to indicate a constant value function, a '1' or '2' to indicate a straight line function, and a '2' or '3' to indicate a parabolic function. In the example of a sinusoidal function, the term field may indicate the number of frequency components in the function.

Figure 6:
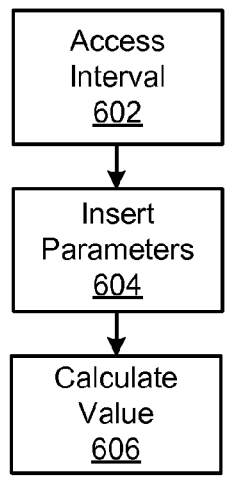
FIG. 6 shows a method for accessing a compressed data value according to an example implementation.

FIG. 6 shows a method for accessing a compressed data value according to an example implementation. The method may include accessing an interval (602). Accessing an interval may include retrieving the function that includes the data point that is to be decompressed. The interval that includes the data point may be retrieved, and the function describing the interval may be obtained.

The method may also include inserting the parameters into the function (604). The parameters may include, for example, coefficients for a polynomial function that approximates the interval that includes the desired data point. With the parameters inserted, an equation describing the dependent variable (e.g., energy use) as a function of the independent variable (e.g., time) may be obtained.

The method may also include calculating the value (606). The value may be calculated by inserting the value of the independent variable (e.g., time) into the equation obtained in (604). The value may then be returned to the application requesting the decompressed value.

Figure 7:
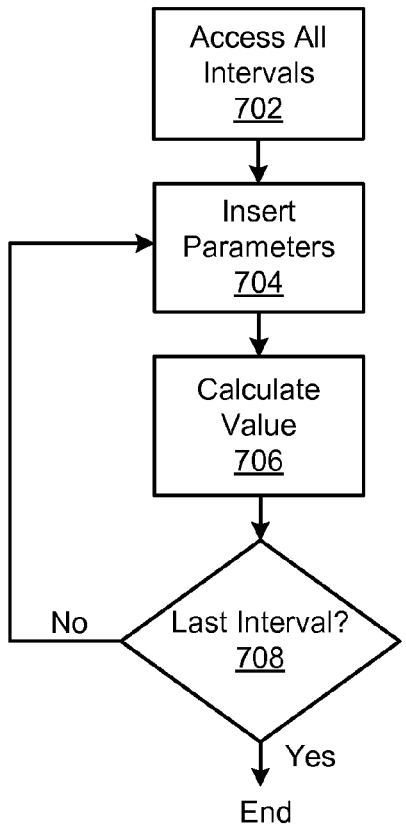
FIG. 7 shows a method for determining a sum of compressed data values over an interval according to an example implementation.

FIG. 7 shows a method for determining a sum of compressed data values over an interval according to an example implementation. The method may include accessing all segments or intervals over which the sum is to be determined (702). The method may include, for example, determining beginning and end points of the interval over which the sum is to be determined, and retrieving or obtaining the functions that approximated the values over each of the intervals.

For each segment or interval, the method may include inserting parameters (704) into the function. The parameters may include coefficients for functions that approximate the data values. Inserting the parameters (704) may produce a function in which the data values may be determined by inserting the independent values (e.g., time) into the functions.

With the parameters inserted into a function for a given segment or interval, the method may include calculating the value (706) of the area. If the segment or interval is an intermediary interval which is entirely included in the interval over which the area is desired, then the area of the entire interval may be calculated. If the segment includes a beginning or end point of the interval over which the area is to be determined, then only the area that begins with the beginning point and/or ends with the end point may be calculated.

After the value of the area has been calculated, the method may determine whether the segment or interval is the last segment or interval of the interval for which the area is to be determined (708). If the segment or interval is the last segment or interval, then the method may end, and the areas of the calculated segments or intervals may be added to arrive at a total area. If the segment or interval is not the last segment or interval, then the area of the next segment or interval may be determined by inserting parameters (704) and calculating the value (706).

Figure 8:
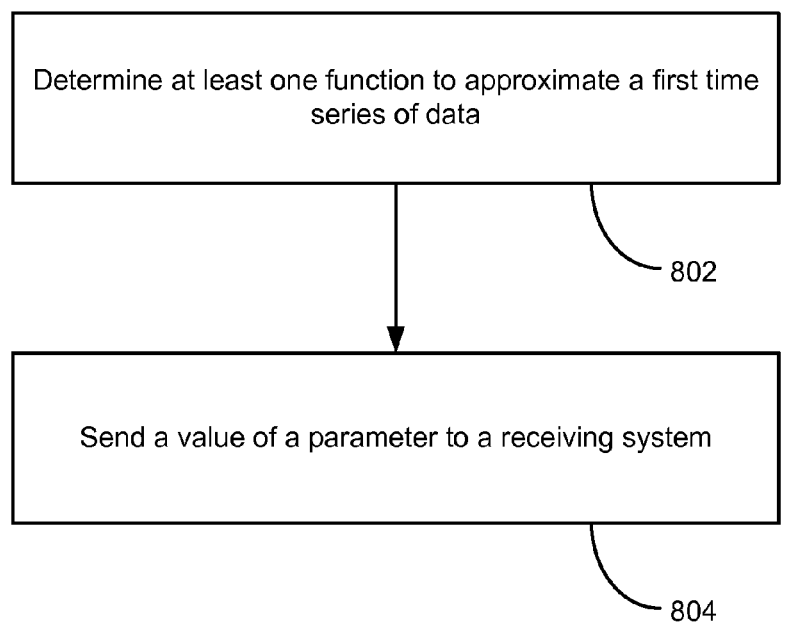
FIG. 8 is a flowchart of a method according to an example implementation.

FIG. 8 is a flowchart of a method according to an example implementation. The method may include determining at least one function to approximate a first time series of data (802). The determining the at least one function may include determining whether a first function of a first type with at least one parameter will approximate a first interval within the first time series of data within a predetermined error margin. If the first function of the first type with the at least one parameter will approximate the first interval within the first time series of data within the predetermined error margin, the method may include updating the first interval by adding a subsequent data point from the first time series of data to the first interval and determine a second function of the first type with the at least one parameter to approximate the first interval. If the first function of the first type with the at least one parameter will not approximate the first interval within the predetermined error margin, the method may include determining whether a third function of the first type with the at least one parameter plus at least one additional parameter will approximate the first interval within the predetermined error margin. If the third function of the first type with the at least one additional parameter will approximate the first interval within the predetermined error margin, the method may include updating the first interval by adding a subsequent data point from the first time series of data to the first interval and determining a fourth function of the first type with the at least one additional parameter to approximate the updated first interval. If the third function of the first type with the additional parameter will not approximate the first interval within the predetermined error margin, the method may include continuing determining whether functions of the first type with additional parameters will approximate the first interval within the predetermined error margin until a maximum number of parameters is reached.

The method may also include sending a value(s) of the parameter(s) for the at least one function to a receiving system (804).

According to an example implementation, the first type of function may be a polynomial function.

According to an example implementation, the first type of function may be a constant value function, a straight line function, or a parabolic function.

According to an example implementation, the first type of function may be a sinusoidal function.

According to an example implementation, the first type of function may be a Fourier series.

According to an example implementation, the predetermined error margin may be a maximum error of data points in the interval.

According to an example implementation, the method may further include receiving the predetermined error margin via user input.

According to an example implementation, the method may further include receiving the maximum number of parameters via user input.

According to an example implementation, the method may further include approximating a second interval from the first time series of data if the first function of the first type with the maximum number of parameters will not approximate the first interval within the predetermined error margin.

According to an example implementation, the method may further include determining a number of data points to include in the first interval based on a first number of parameters needed to approximate the first interval and a second number of parameters needed to approximate a second interval from the first time series of data.

According to an example implementation, the method may further include determining a number of data points to include in the first interval based on comparing a first ratio of a first number of parameters needed to approximate a first number of data points to a second ratio of a second number of parameters needed to approximate a second number of data points.

According to an example implementation, the adding the subsequent data point to the first interval from the first time series of data may include adding the subsequent data point to the first interval without adding an additional parameter to the first function.

Figure 9:
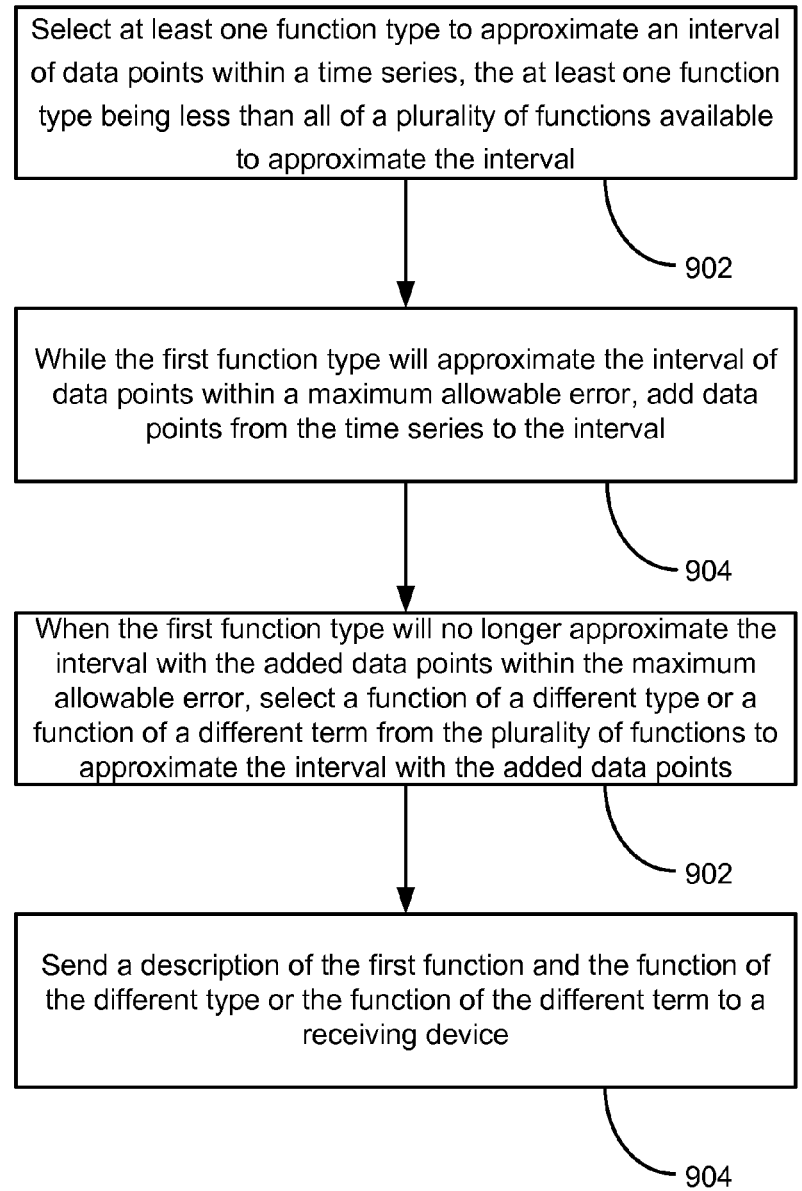
FIG. 9 is a flowchart showing a method according to another example implementation.

FIG. 9 is a flowchart showing a method according to another example implementation. The method may include selecting at least one function type to approximate an interval of data points within a time series, the at least one function type being less than all of a plurality of functions available to approximate the interval (902). The method may also include, while the first function type will approximate the interval of data points within a maximum allowable error, adding data points from the time series to the interval (904). The method may also include, when the first function type will no longer approximate the interval with the added data points within the maximum allowable error, selecting a function of a different type or a function of a different term from the plurality of functions to approximate the interval with the added data points (906). The method may also include sending a description of the first function and the function of the different type or the function of the different term to a receiving device (908).

According to an example implementation, the first function type may include constant value functions, straight line functions, and parabolic functions.

According to an example implementation, the data points may represent energy usage.

According to an example implementation, the first function may be a polynomial function and the function of the different type may be a sinusoidal function.

According to an example implementation, the first function may be a constant value function and the function of the different term may be a straight line function.

Figure 10:
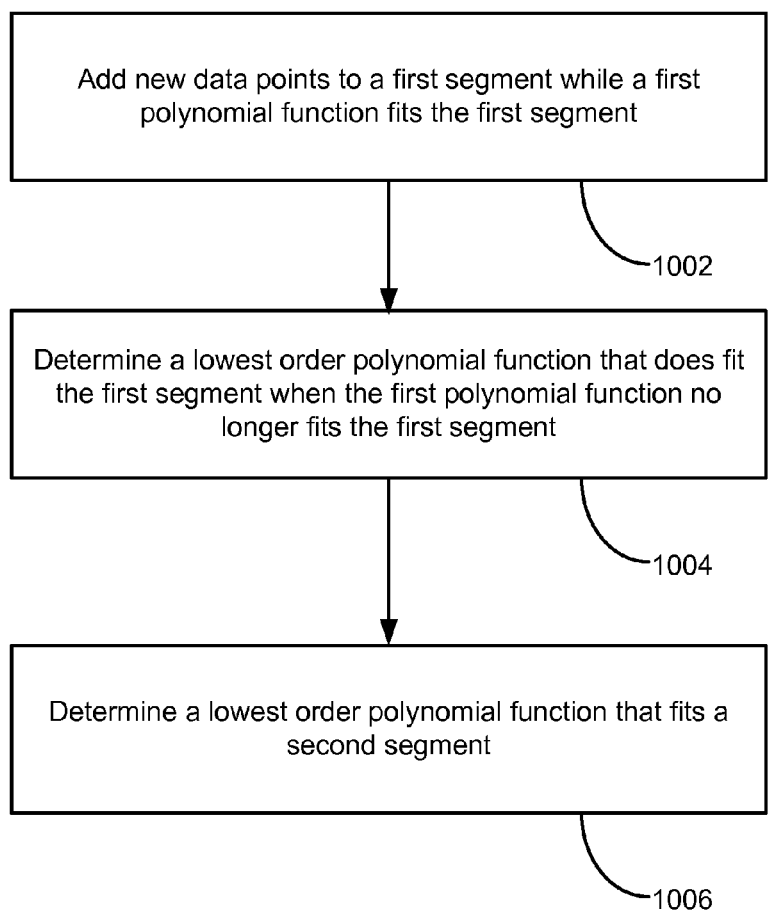
FIG. 10 is a flowchart of a method according to another example implementation.

FIG. 10 is a flowchart of a method according to another example implementation. The method may include adding new data points to a first segment while a first polynomial function fits the first segment (1002). For example, while an $n^{th}$ order polynomial function fits the first segment of data points within a maximum allowable error, the method may include adding a new data point to the first segment and determine whether the $n^{th}$ order polynomial function still fits the first segment.

The method may also include determining a lowest order polynomial function that does fit the first segment when the first polynomial function no longer fits the first segment (1004). For example, when the $n^{th}$ order polynomial function no longer fits the first segment, the method may include storing beginning and end data points which fit into the $n^{th}$ order polynomial function within the maximum allowable error, +m), th determining a lowest order, $(n+m)^{th}$, polynomial function that does fit the first segment, and while the $(n+m)^{th}$ order polynomial function fits the first segment of data points within the maximum allowable error, adding a new data point to the first segment and determine whether the $(n+m)^{th}$ order polynomial function still fits the first segment. When the $(n+m)^{th}$ order polynomial function no longer fits the first segment: the method may include storing beginning and end data points which fit into the $(n+m)^{th}$ order polynomial function within the maximum allowable error, determining a first ratio by dividing a number of data points which fit into the $n^{th}$ order polynomial function within the maximum allowable error by n, determining a second ratio by dividing a number of data points which fit into the $(n+m)^{th}$ order polynomial function within the maximum allowable error by (n+m), and selecting, for membership in the first segment, either the data points between the stored beginning and end data points which fit into the $n^{th}$ order polynomial function or the data points between the stored beginning and end data points which fit into the $(n+m)^{th}$ order polynomial function, based on comparing the first ratio to the second ratio.

The method may also include determining a lowest order polynomial function that fits a second segment. For example, the method may include determining a lowest order polynomial function for which data points within a second segment fit within the maximum allowable error, the second segment beginning after the stored end data point that fits into either the $n^{th}$ order polynomial function or the $(n+m)^{th}$ order polynomial function, based on the comparing the first ratio to the second ratio.

According to an example implementation, the determining the lowest order, $(n+m)^{th}$, polynomial function that does fit the first segment may include iteratively approximating the first segment with polynomial functions that are a single order higher until a polynomial function fits the first segment within the maximum allowable error.

According to an example implementation, the determining the lowest order polynomial function for which data points within the second segment fit within the maximum allowable error may include, while an $l^{th}$ order polynomial function fits the second segment within the maximum allowable error, adding a new data point to the second segment and determining whether the $l^{th}$ order polynomial function still fits the second segment, and when the $l^{th}$ order polynomial function no longer fits the second segment, determining a lowest order, (l+k), polynomial function that does fit the second segment, and while the $(l+k)^{th}$ order polynomial function fits the second segment of data points within the maximum allowable error, adding a new data point to the second segment.

Implementations of the various techniques described herein may be implemented in digital electronic circuitry, or in computer hardware, firmware, software, or in combinations of them. Implementations may implemented as a computer program product, i.e., a computer program tangibly embodied in an information carrier, e.g., in a machine-readable storage device, for execution by, or to control the operation of, data processing apparatus, e.g., a programmable processor, a computer, or multiple computers. A computer program, such as the computer program(s) described above, can be written in any form of programming language, including compiled or interpreted languages, and can be deployed in any form, including as a stand-alone program or as a module, component, subroutine, or other unit suitable for use in a computing environment. A computer program can be deployed to be executed on one computer or on multiple computers at one site or distributed across multiple sites and interconnected by a communication network.

Method steps may be performed by one or more programmable processors executing a computer program to perform functions by operating on input data and generating output. Method steps also may be performed by, and an apparatus may be implemented as, special purpose logic circuitry, e.g., an FPGA (field programmable gate array) or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only memory or a random access memory or both. Elements of a computer may include at least one processor for executing instructions and one or more memory devices for storing instructions and data. Generally, a computer also may include, or be operatively coupled to receive data from or transfer data to, or both, one or more mass storage devices for storing data, e.g., magnetic, magneto-optical disks, or optical disks. Information carriers suitable for embodying computer program instructions and data include all forms of non-volatile memory, including by way of example semiconductor memory devices, e.g., EPROM, EEPROM, and flash memory devices; magnetic disks, e.g., internal hard disks or removable disks; magneto-optical disks; and CD-ROM and DVD-ROM disks. The processor and the memory may be supplemented by, or incorporated in special purpose logic circuitry.

To provide for interaction with a user, implementations may be implemented on a computer having a display device, e.g., a cathode ray tube (CRT) or liquid crystal display (LCD) monitor, for displaying information to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input.

Implementations may be implemented in a computing system that includes a back-end component, e.g., as a data server, or that includes a middleware component, e.g., an application server, or that includes a front-end component, e.g., a client computer having a graphical user interface or a Web browser through which a user can interact with an implementation, or any combination of such back-end, middleware, or front-end components. Components may be interconnected by any form or medium of digital data communication, e.g., a communication network. Examples of communication networks include a local area network (LAN) and a wide area network (WAN), e.g., the Internet.

While certain features of the described implementations have been illustrated as described herein, many modifications, substitutions, changes and equivalents will now occur to those skilled in the art. It is, therefore, to be understood that the appended claims are intended to cover all such modifications and changes.

What is claimed is:

1. At least one non-transitory computer-readable storage medium comprising instructions stored thereon that, when executed by at least one processor, are configured to cause a computing system to at least:
   determine at least one function to approximate a first time series of data, the determining the at least one function comprising:
   determining whether a first function of a first type with at least one parameter will approximate a first interval within the first time series of data within a predetermined error margin;
   if the first function of the first type with the at least one parameter will approximate the first interval within the predetermined error margin, update the first interval by adding a subsequent data point from the first time series of data to the first interval and determine a second function of the first type with the at least one parameter to approximate the first interval; and
   if the first function of the first type with the at least one parameter will not approximate the first interval within the predetermined error margin, determine whether a third function of the first type with the at least one parameter plus at least one additional parameter will approximate the first interval within the predetermined error margin;
   if the third function of the first type with the at least one additional parameter will approximate the first interval within the predetermined error margin, update the first interval by adding a subsequent data point from the first time series of data to the first interval and determine a fourth function of the first type with the at least one additional parameter to approximate the updated first interval; and
   if the third function of the first type with the additional parameter will not approximate the first interval within the predetermined error margin, continue determining whether the functions of the first type with additional parameters will approximate the first interval within the predetermined error margin until a maximum number of parameters is reached; and
   send a value(s) of the parameter(s) for the function(s) of the first type to a receiving system.

2. The at least one non-transitory computer-readable storage medium of claim 1, wherein the first type of function is a polynomial function.

3. The at least one non-transitory computer-readable storage medium of claim 1, wherein the first type of function is a constant value function, a straight line function, or a parabolic function.

4. The at least one non-transitory computer-readable storage medium of claim 1, wherein the first type of function is a sinusoidal function.

5. The at least one non-transitory computer-readable storage medium of claim 1, wherein the first type of function is a Fourier series.

6. The at least one non-transitory computer-readable storage medium of claim 1, wherein the predetermined error margin is a maximum error of data points in the interval.

7. The at least one non-transitory computer-readable storage medium of claim 1, wherein the instructions are further configured to cause the computing system to receive the predetermined error margin via user input.

8. The at least one non-transitory computer-readable storage medium of claim 1, wherein the instructions are further configured to cause the computing system to receive the maximum number of parameters via user input.

9. The at least one non-transitory computer-readable storage medium of claim 1, wherein the instructions are further configured to cause the computing system to approximate a second interval from the first time series of data if the function of the first type with the maximum number of parameters will not approximate the first interval within the predetermined error margin.

10. The at least one non-transitory computer-readable storage medium of claim 1, wherein the instructions are further configured to cause the computing system to determine a number of data points to include in the first interval based on a first number of parameters needed to approximate the first interval and a second number of parameters needed to approximate a second interval from the first time series of data.

11. The at least one non-transitory computer-readable storage medium of claim 1, wherein the instructions are further configured to cause the computing system to determine a number of data points to include in the first interval based on comparing a first ratio of a first number of parameters needed to approximate a first number of data points to a second ratio of a second number of parameters needed to approximate a second number of data points.

12. The at least one non-transitory computer-readable storage medium of claim 1, wherein the adding the subsequent data point to the first interval from the first time series of data includes adding the subsequent data point to the first interval without adding an additional parameter to the first function.

13. At least one non-transitory computer-readable storage medium comprising instructions stored thereon that, when executed by at least one processor, are configured to cause a computing system to at least:
select at least one function type to approximate an interval of data points within a time series, the at least one function type being less than all of a plurality of functions available to approximate the interval;
while the at least one function type will approximate the interval of data points within a maximum allowable error, add data points from the time series to the interval;
when the at least one function type will no longer approximate the interval with the added data points within the maximum allowable error, select a function of a different type or a function of a different term from the plurality of functions to approximate the interval with the added data points; and
send a description of the at least one function type and the function of the different type or the function of the different term to a receiving device.

14. The at least one non-transitory computer-readable storage medium of claim 13, wherein the at least one function type includes constant value functions, straight line functions, and parabolic functions.

15. The at least one non-transitory computer-readable storage medium of claim 13, wherein the data points represent energy usage.

16. The at least one non-transitory computer-readable storage medium of claim 13, wherein the at least one function type is a polynomial function and the function of the different type is a sinusoidal function.

17. The at least one non-transitory computer-readable storage medium of claim 13, wherein the at least one function type is a constant value function and the function of the different type is a straight line function.

18. At least one non-transitory computer-readable storage medium comprising instructions stored thereon that, when executed by at least one processor, are configured to cause a computing system to at least:
while an $n^{th}$ order polynomial function fits a first segment of data points from a time series within a maximum allowable error, add a new data point from the time series to the first segment and determine whether the $n^{th}$ order polynomial function still fits the first segment;
when the $n^{th}$ order polynomial function no longer fits the first segment:
store beginning and end data points which fit into the $n^{th}$ order polynomial function within the maximum allowable error;
determine a lowest order, $(n+m)^{th}$, polynomial function that does fit the first segment; and
while the $(n+m)^{th}$ order polynomial function fits the first segment of data points within the maximum allowable error, add a new data point from the time series to the first segment and determine whether the $(n+m)^{th}$ order polynomial function still fits the first segment; and
when the $(n+m)^{th}$ order polynomial function no longer fits the first segment:
store beginning and end data points which fit into the $(n+m)^{th}$ order polynomial function within the maximum allowable error;
determine a first ratio by dividing a number of data points which fit into the $n^{th}$ order polynomial function within the maximum allowable error by n;
determine a second ratio by dividing a number of data points which fit into the $(n+m)^{th}$ order polynomial function within the maximum allowable error by (n+m); and
select, for membership in the first segment, either the data points between the stored beginning and end data points which fit into the $n^{th}$ order polynomial function or the data points between the stored beginning and end data points which fit into the $(n+m)^{th}$ order polynomial function, based on comparing the first ratio to the second ratio; and
determine a lowest order polynomial function for which data points within a second segment fit within the maximum allowable error, the second segment beginning after the stored end data point that fits into either the $n^{th}$ order polynomial function or the $(n+m)^{th}$ order polynomial function, based on the comparing the first ratio to the second ratio.

19. The at least one non-transitory computer-readable storage medium of claim 18, wherein the determining the lowest order, $(n+m)^{th}$, polynomial function that does fit the first segment includes iteratively approximating the first segment with polynomial functions that are a single order higher until a polynomial function fits the first segment within the maximum allowable error.

20. The at least one non-transitory computer-readable storage medium of claim 18, wherein the determining the lowest order polynomial function for which data points within the second segment fit within the maximum allowable error includes:

- while an $l^h$ order polynomial function fits the second segment within the maximum allowable error, add a new data point from the time series to the second segment and determine whether the $l^h$ order polynomial function still fits the second segment;
- when the $l^h$ order polynomial function no longer fits the second segment:
- determine a lowest order, (l+k), polynomial function that does fit the second segment; and
- while the $(l+k)^{th}$ order polynomial function fits the data points within the second segment within the maximum allowable error, add a new data point from the time series to the second segment.

\* \* \* \* \*